United States Patent [19]
Brueck et al.

[11] Patent Number: 6,042,998
[45] Date of Patent: *Mar. 28, 2000

[54] METHOD AND APPARATUS FOR EXTENDING SPATIAL FREQUENCIES IN PHOTOLITHOGRAPHY IMAGES

[75] Inventors: Steven R. J. Brueck; Saleem H. Zaidi, both of Albuquerque, N.Mex.

[73] Assignee: The University of New Mexico, Albuquerque, N.Mex.

[*] Notice: This patent is subject to a terminal disclaimer.

[21] Appl. No.: 08/932,428

[22] Filed: Sep. 17, 1997

[51] Int. Cl.$^7$ ................................................ G03C 5/00
[52] U.S. Cl. .................... 430/316; 430/312; 430/323; 430/394
[58] Field of Search .................... 430/396, 397, 430/313, 312, 314, 316, 322, 323, 394

[56] References Cited

U.S. PATENT DOCUMENTS

| | | | |
|---|---|---|---|
| 4,859,548 | 8/1989 | Heise et al. | 430/1 |
| 5,116,718 | 5/1992 | Dalton et al. | 430/327 |
| 5,216,257 | 6/1993 | Brueck et al. | 250/548 |
| 5,343,292 | 8/1994 | Brueck et al. | 356/363 |
| 5,415,835 | 5/1995 | Brueck et al. | 430/311 |
| 5,486,449 | 1/1996 | Hosono et al. | 430/328 |
| 5,705,321 | 1/1998 | Brueck et al. | 430/316 |
| 5,759,744 | 6/1998 | Brueck et al. | 430/312 |
| 5,790,254 | 8/1998 | Ausschnitt | 356/372 |
| 5,801,075 | 9/1998 | Gardner et al. | 438/197 |

OTHER PUBLICATIONS

D. H. Ziger and C. A. Mack "Generalized Approach toward Modeling Resist Performance," AIChE Jour. 37, 1863–1874 (1991).

W. D. Hinsberg, S.A. MacDonald, L. A. Pederson, and C. G. Willson "A Lithographic Analog of Color Photography: Self–Aligning Photolithography Using a Resist with Wavelength–Dependent Tone," Jour. Imaging Sci. 33, 129–135 (1989).

*Primary Examiner*—Janet Baxter
*Assistant Examiner*—Jill N. Holloman
*Attorney, Agent, or Firm*—Snell & Wilmer, L.L.P.

[57] ABSTRACT

The present invention extends the available spatial frequency content of an image through the use of a method and apparatus for combining nonlinear functions of intensity to form three dimensional patterns with spatial frequencies that are not present in either of the individual exposures and that are beyond $2/\lambda$ in all three spatial directions. The resulting pattern has spatial frequency content beyond the limits set by optical propagation of spatial frequencies limited to $2/\lambda$ (e.g. pitch reduction from $\sim\lambda/2$ to at least $\sim\lambda/4$). The extension of spatial frequencies preferably extends the use of currently existing photolithography capabilities, thereby resulting in a significant economic impact. Multiplying the spatial frequency of lithographically defined structures suitably allows for substantial improvements in, inter alia, crystal growth, quantum structure growth and fabrication, flux pinning sites for high-$T_c$ superconductors, form birefringent materials, reflective optical coatings, photonic bandgap, electronics, optical/magnetic storage media, arrays of field emitters, DRAM (Dynamic Random Access Memory) capacitors and in other applications requiring large areas of nm-scale features.

32 Claims, 19 Drawing Sheets

Dimensions in units of CD

Rectangle is 6x6 unit cell

Negative Tone Subtractive Processing

FIG. 9B

Positive Tone Additive/Subtractive Processing
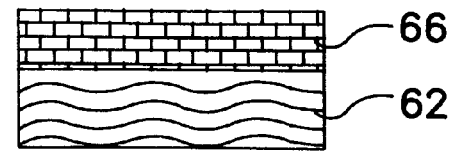
FIG. 10A
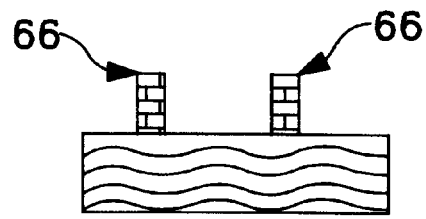
FIG. 10B
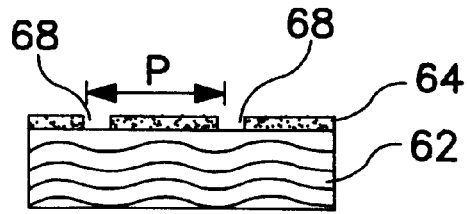
FIG. 10C
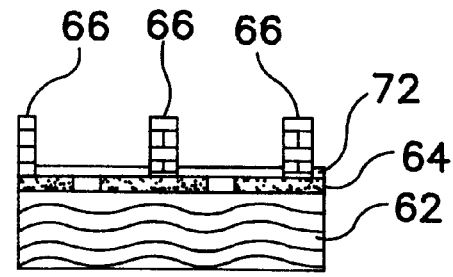
FIG. 10D
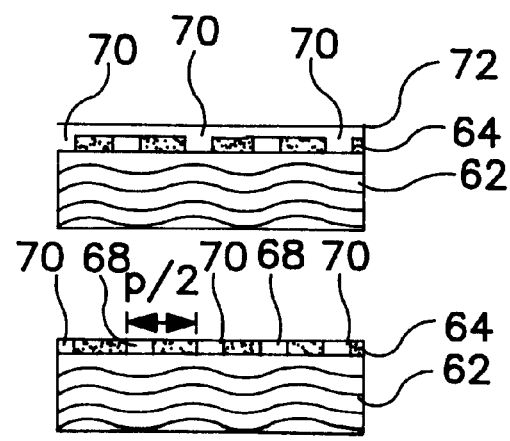
FIG. 10E
FIG. 10F

METHOD AND APPARATUS FOR EXTENDING SPATIAL FREQUENCIES IN PHOTOLITHOGRAPHY IMAGES

RELATED APPLICATIONS

The following patents and patent applications are herein incorporated by reference: U.S. Pat. No. 5,216,257—S. R. J. Brueck and Saleem H. Zaidi, Method and Apparatus for Alignment and Overlay of Submicron Lithographic Features (issued Jun. 1, 1993); U.S. Pat. No. 5,343,292—S. R. J. Brueck and Saleem H. Zaidi, Method and Apparatus for Alignment of Submicron Lithographic Structures (issued Aug. 30, 1994); U.S. Pat. No. 5,415,835—S. R. J. Brueck and Saleem Zaidi, Method and Apparatus for Fine-Line Interferometric Lithography (issued May 16, 1995); U.S. Pat. No. 5,759,744—S. R. J. Brueck, Xiaolan Chen, Daniel J. Devine and Saleem H. Zaidi, Methods and Apparatuses for Lithography of sparse Arrays of sub-micrometer Features (issued Jun. 2, 1998); U.S. patent application Ser. No. 08/614,991—S. R. J. Brueck, Xiaolan Chen, Daniel J. Devine and Saleem H. Zaidi, Methods and Apparatuses for Lithography of sparse Arrays of Sub-micrometer Features (a continuing, applicator was filed on Jul. 15, 1998 now U.S. Pat. No. 5,674,652); U.S. patent application Ser. No. 07/662,676—K. P. Bishop, S. R. J. Brueck, S. M. Gaspar, K. C. Hickman, J. R. McNeil, S. S. Naqvi, B. L. Stallard and G. D. Tipton, Use of Diffracted Light From Latent Images in Photoresist for Exposure Control (filed Feb. 26, 1991); U.S. Pat. No. 5,705,321—S. R. J. Brueck, An-Shiang Chu, Saleem Zaidi, and Bruce L. Draper, Method for Manufacture of Quantum Sized Periodic Structures in Si Materials (issued Jan. 6, 1998); U.S. patent application Ser. No. 08/786,066, now abandoned,—S. R. J. Brueck, Xiaolan Chen, Andrew Frauenglass and Saleem Hussain Zaidi, Method and Apparatus for Integrating Optical and Interferometric Lithography to Produce Complex Patterns (filed Jan. 21, 1997); Semiconductor Industry Association, National Technology Roadmap for Semiconductors (1994); J. W. Goodman, *Introduction to Fourier Optics*, $2^{nd}$ Ed., (McGraw Hill, New York, 1996); J. W. Goodman, *Statistical Optics*, (John Wiley, New York, 1985); Xiaolan Chen, S. H. Zaidi, S. R. J. Brueck and D. J. Devine, "Interferometric Lithography of Submicrometer Sparse Hole Arrays for Field-emission Display Applications," Jour. Vac. Sci. Tech. B14, 3339–3349 (1996); S. H. Zaidi and S. R. J. Brueck, "Multiple-exposure interferometric lithography," Jour. Vac. Sci. Tech. B11, 658 (1992); R. Ziger and C. A. Mack "Generalized Approach toward Modeling Resist Performance," AIChE Jour. 37, 1863–1874 (1991); *Introduction to Microlithography, Second Edition*, L. F. Thompson, C. Grant Willson and M. J. Bowden, eds. (American Chemical Society, Washington D.C., 1994) and, W. D. Hinsberg, S. A. McDonald, L. A. Pederson and C. G. Willson, "A Lithographic Analog of Color Photography: Self-Aligning Photolithography using a Resist with Wavelength-Dependent Tone," Jour. Imaging Sci. 33, 129–133 (1989).

FEDERALLY-SPONSORED RESEARCH OR DEVELOPMENT

The United States Government has a paid-up license in this invention and the right in limited circumstances to require the patent owner to license others on reasonable terms as provided by the terms of Grant No. N66001-96-C-8617 awarded by the United States Department of the Navy.

FIELD OF THE INVENTION

The present invention is related, generally, to a method and apparatus for extending the available spatial frequency content of an image, and more particularly, to a method and apparatus for combining nonlinear functions of intensity of multiple images to form three dimensional patterns with spatial frequencies that are not present in any of the individual exposures and whose magnitudes are larger than $2/\lambda$, the limit of linear optical system response, in all three spatial directions.

BACKGROUND OF THE INVENTION

The quality of an image is limited by the spatial frequencies within the image. In general, the maximum spatial frequency contained in an optically defined image is $\sim 2NA/\lambda$ where NA is the lens numerical aperture (the radius of the lens aperture divided by the distance from the exit face of the lens to the focal plane) and $\lambda$ is the optical wavelength. Thus, decreasing $\lambda$ and increasing NA typically results in increased spatial frequency content and in an improved, higher resolution image. The convention adopted throughout this disclosure is that spatial frequencies are given as the inverse of the corresponding length scale in the image. Therefore, a factor of $2\pi$ is necessary to convert these spatial frequencies to the magnitude of wavevectors for detailed modeling. Hereinafter, "pitch," with dimensions of nm, is used to refer to the distance between features of a periodic pattern while "period," with dimensions of $nm^{-1}$, is used interchangeably with spatial frequency.

Historically, the semiconductor industry has worked to both decrease $\lambda$ and increase NA in its steady progress towards smaller feature sizes. There are several factors that together suggest that continued improvements to $\lambda$ and NA are most likely not feasible and the industry will have to undergo a significant change in lithographic technique. Problems typically include the reduction of the feature size to below the available optical wavelengths, often decreasing the manufacturing process window, while at the same time demanding increased linewidth control for high-speed circuit operation. Moreover, for wavelengths below the 193-nm ArF wavelength, transmitting optical materials are typically no longer available, forcing the need for an all-reflective system. However, an all-reflective system is often problematical since current multi-layer reflector and aspheric optical technologies are typically not sufficiently developed to meet the feature size needs. The transition to reflective optics will most likely result in a significant reduction in the possible NAs, thereby reducing the benefit of shorter wavelengths. Optical sources with wavelengths shorter than 193 nm may also not provide sufficient average power for high throughput manufacturing.

Furthermore, the complexity of the masks typically increases by a factor of about four for each ultra-large scale integration (ULSI) generation (i.e. about four times as many transistors on a die). Additionally, many of the potential advances in optical lithography, often collectively know as resolution-enhancement techniques, typically lead to increased mask complexity (serifs, helper bars, and other sub-resolution features) or require a three dimensional mask in place of the traditional chrome-on-glass two-dimensional masks (phase shift techniques). The increased complexities often increase the manufacturing difficulties and costs, thereby commonly reducing the yield of the complex masks. Moreover, the transition to wavelengths shorter than 193 nm will most likely require a drastic changeover to reflective masks since transmissive optical materials with adequate optical quality are typically not available.

The limiting CD (critical dimension) of imaging optical systems is usually stated as $\kappa_1 \lambda/NA$, where $\kappa_1$ is a function of manufacturing tolerances as well as of the optical system, λ is the center wavelength of the exposure system and NA is the numerical aperture of the imaging optical system. Typical values of $\kappa_1$ range from about 1.0 down to ~0.5. Projections for the 193 nm optical lithography tool are an NA of 0.6 which leads to a limiting CD of ~0.16 micrometer. Alternative lithographic technologies are being investigated including, inter alia, X-ray, e-beam, ion-beam and probe-tip technologies. However, none of these technologies has as yet emerged as a satisfactory alternative to optical lithography for volume manufacturing applications.

Existing nanofabrication techniques, such as e-beam lithography, have been used to demonstrate nm-scale features for a variety of applications including, inter alia, textured substrates for crystal growth, quantum structure growth and fabrication, flux pinning sites for high-$T_c$ superconductors, form birefringent materials, reflective optical coatings, artificially created photonic bandgap materials, electronics, optical/magnetic storage media, arrays of field emitters, DRAM (Dynamic Random Access Memory) capacitors and in other applications requiring large areas of nm-scale features. However, these existing nanofabrication techniques typically remain uneconomic in that the techniques do not allow low cost manufacturing of large areas of nm-scale patterns.

In the field of textured substrates for crystal growth, researchers have investigated vicinal growth (epitaxial growth on a crystal substrate polished several degrees off-axis to expose steps in the crystal faces) to provide seeding sites for growth initiation. This approach is often problematic in that the crystal steps are not well-defined and the variations lead to inhomongeneous nucleation. Moreover, in prior art epitaxial growth, the strain often limits the thickness of the film before dislocations and other defects are formed to relieve the stress.

The field of quantum structure growth and fabrication is often similar to the above crystal growth application usually with the exception that the growth would involve at least two materials: a lower bandgap material typically surrounded by a higher bandgap material to provide a quantum wire or a quantum dot. Most of the current work on extremely thin heterostructure materials is typically concentrated on quantum wells, 2-D planar films with thickness on the order of electronic wavefunctions (~0.1–50 nm) sandwiched in-between larger bandgap materials that form a potential barrier to confine charge carriers. These quantum well materials have progressed from scientific study to important applications in high speed transistors and in optoelectronic devices such as lasers and detectors. Attempts at further reducing dimensionality from 2-D sheets to 1-D wires and 0-D boxes are often classified into three major directions: (1) lithographic definition limited to ~100 nm by current techniques (primarily electron-beam lithography) and not presently scalable to large areas; (2) orientationally selective growth on wafers with large-area ($\mu$m-scale) patterns which typically has significant problems with defects associated with the imprecise fabrication and the three orders-of-magnitude scale reduction required, from ~1000 nm to ~1 nm; and (3) self-assembled quantum dots usually based on modifying the growth conditions to achieve nucleation of isolated dots of material. The size and placement uniformity of the dots produced by this technique is often limited by the unavoidable randomness of the nucleation and growth processes. The development of a method for uniformly defining nucleation sites by a lithographic process would have a major impact on this field.

In the field of flux pinning sites for high-$T_c$ superconductors, allowable current densities in high temperature superconductors are often limited by the motion of flux lines that induces loss and heating resulting in a phase transition to a non-superconducting state. The critical current density is the current density at which this transition occurs. An improvement potentially could be achieved by a fabrication technique that provides a predetermined density and spatial pattern of flux pinning sites by inducing localized defects in the film to trap the flux lines. In order to achieve the desired critical currents, the density of trap sites typically needs to be on the nm-scale (~5–50 nm spacings).

In the area of periodic structures, such as gratings, which play a very important role in optics, periodicities shorter than the optical wavelength could give rise to significant modifications in both the linear and nonlinear optical response of materials. For example, one-dimensional gratings with pitches much less than the wavelength can result in a birefringent response such that the reflectivity and transmission differs between light polarized along the grating and light polarized perpendicular to the grating.

Reflective optical coatings, known as Bragg reflectors, often consist of layered stacks of different materials with each layer having a ¼-wave optical thickness. Very high reflectivities can be achieved, even with relatively small refractive index differences between the materials by using a sufficient number of layers. The extension of this concept to a periodic three dimensional optical structure is usually known as a photonic crystal. In the same way as semiconductor crystals have forbidden energy gaps within which there are no allowed electronic states, photonic crystals can exhibit photonic bandgaps where specific wavelength bands of light cannot penetrate. The ability to incorporate defects in this structure can give rise to important classes of optical emitters with unique properties such as thresholdless lasers. This new class of materials could most likely be applied to a wide range of applications.

In the electronic field, semiconductor electronics have typically been following an exponential growth in the number of transistors on a chip, increasing by a factor of four each generation (with a typical 3-year duration for each generation). As discussed above, conventional optical lithography is reaching practical limits set by available λ and NA, therefore, an advancement in lithographic techniques will be needed to manufacture these circuits.

In the field of storage media, both magnetic and optical storage densities (bits/cm$^2$) typically have been increasing dramatically. The increased storage densities are typically a result of improvements to magnetic/optical read/write heads and to the storage media. However, traditional continuous media often allows domains to compete and grow at the expense of other domains to find the most energetically favorable configuration. Moreover, as densities continue to increase, it becomes increasingly difficult for the tracking electronics to resolve smaller distances. A cost-effective lithographic patterning technology that allows nano-scale segmentation of the storage medium potentially could address both of these issues.

Field-emitters are potentially a promising technology for cold cathode electronic devices, such as, for example, mm-wave tubes and displays. These devices rely on high electric field extraction of electrons from extremely small emission areas. In the prior art, field emitter tips are typically formed by conventional lithographic definition and processing "tricks" such as shadow evaporation or three-dimensional oxidation of Si to form the nanostructures. However, the feature and current densities resulting from the prior art lower resolution lithographic techniques is not typically sufficient for many applications. A higher resolution, nano-scale lithographic technique would have a significant impact on the development of these technologies.

In the area of DRAMs, noise considerations in readout circuitry typically require a substantially fixed capacitance for DRAM circuits independent of the total number of memory cells. Since the two-dimensional footprint available for the capacitor decreases by a factor of approximately two each DRAM generation (e.g., the 256-Mbit generation usually is scaled for a smallest printed feature (or critical dimension (CD)) of 0.25 $\mu$m and this scaling is reduced to a CD of 0.18 $\mu$m for the 1-Gbit generation; [$(0.18/0.25)^2$~0.5]), simple scaling would result in an approximate factor of two reduction in the capacitance each generation. One possible approach to maintaining the needed minimum capacitance is to use the third dimension by convoluting a thick capacitor structure to increase the surface area within the same two-dimensional footprint. This requires a lithographic capability beyond that required to define the circuit. However, since the industry is typically at the limits of its current lithographic capability in fabricating the circuit patterns, an improved nano-scale lithographic process is required to meet these needs. Random process such as the deposition of nano-grain particles as etch masks have been demonstrated. However, the control of particle size and placement is typically inadequate for a high-yield manufacturing process. Here again, development of controlled nano-scale lithography process would potentially have a significant impact.

Interferometric lithography, the use of the standing wave pattern produced by two or more coherent optical beams to expose a photoresist layer, often provides a very simple technique to produce the requisite scale for the next several ULSI generations. Compared to the aforementioned problems with lithographic and non-lithographic techniques, interferometric lithography typically provides a simple, inexpensive technique for defining extreme submicron array patterns over a large area without the need for a photomask. Interference effects between two coherent laser beams often have been used to create simple grating patterns in a photoresist. Furthermore, interference lithography typically has a very large depth of field, so patterns can be exposed over large variations in topography. Moreover, interferometric lithography often allows very high resolution patterns to be defined on a wafer, substantially finer than those available from conventional lithographic techniques, with a throughput often comparable to that of a conventional optical stepper. Therefore, a large number of structures applicable to microelectronic devices and circuits can be fabricated using interferometric lithography, either alone or in combination with other lithographic techniques such as optical steppers. See U.S. Pat. No. 5,415,835—S. R. J. Brueck and Saleem Zaidi, Method and Apparatus for Fine-Line Interferometric Lithography (issued May 16, 1995); U.S. patent application Ser. No. 08/407,067—S. R. J. Brueck, Xiaolan Chen, Daniel J. Devine and Saleem H. Zaidi, Methods and Apparatuses for Lithography of sparse Arrays of Sub-micrometer Features (CIP filed Mar. 13, 1995); U.S. patent application Ser. No. 08/614,991—S. R. J. Brueck, Xiaolan Chen, Daniel J. Devine and Saleem H. Zaidi, Methods and Apparatuses for Lithography of sparse Arrays of sub-micrometer Features (divisional filed Mar. 13, 1996) and, which are herein incorporated by reference.

The limiting spatial frequency of interferometric lithography is ~$\lambda/2$, where $\lambda$ is the laser wavelength, and the CD for 1:1 lines and spaces is ~$\lambda/4$. In contrast to optical lithography which at I-line has a projected limit of $\kappa_x\lambda/NA$~0.3 $\mu$m, interferometric lithography has a limiting resolution of ~0.09 $\mu$m at the same wavelength. Using the 193 wavelength, the limiting resolution of interferometric lithography is ~0.05 $\mu$m which is already better than the current projections for EUV lithography (a wavelength of 13 nm and a NA of 0.1 leading to a CD of 0.08 $\mu$m at a $\kappa_1$ of 0.6).

One of the major challenges for interferometric lithography is developing sufficient pattern flexibility to produce useful circuit patterns. A two-beam interferometric exposure produces a periodic pattern of lines and spaces over the entire field. Multiple beam (4 or 5) exposures typically produce relatively simple repeating two-dimensional patterns such as holes or posts. More complex structures can often be formed by using multiple interferometric exposures as described in U.S. Pat. No. 5,415,835—S. R. J. Brueck and Saleem H. Zaidi, Method and Apparatus for Fine-Line Interferometric Lithography (filed Sep. 16, 1992; issued May 16, 1995) and in Jour. Vac. Sci. Tech. B11, 658 (1992), which are herein incorporated by reference. Additional flexibility can often be attained by combining interferometric and optical lithography as also described in the above patent. However, thus far, demonstrations have typically been limited to fairly simple examples, e.g. defining an array of lines by interferometric lithography and delimiting the field by a second optical exposure. Even with multiple exposures, more complex structures are often produced, but the overall patterns are restricted to repetitive structures.

Imaging interferometric lithography (IIL) has recently been developed [See U.S. patent application Ser. No. 08/786,066—S. R. J. Brueck, Xiaolan Chen, Andrew Frauenglass and Saleem Hussain Zaidi, Method and Apparatus for Integrating Optical and Interferometric Lithography to Produce Complex Patterns (filed Jan. 21, 1997)] as an approach to extending the spatial frequency space available for imaging, and hence allowing higher resolution images of arbitrary patterns than are usually possible with conventional optical imaging approaches. IIL is based on a linear systems approach wherein the spatial frequency space limitation of a traditional optical system is circumvented by combining optical and interferometric lithographies to print regions of frequency space. Multiple exposures in the same photoresist level are then typically used to add together the different spatial frequency components to produce a final image that is significantly improved over that available with traditional, single-exposure imaging optical lithography. Using this approach, it was shown that images containing spatial frequency components out to the limits of optics, $2/\lambda$, could be achieved.

As an example of the increased spatial frequency space available using IIL, FIG. 1 shows a prototypical array structure that might be part of a ultra-large-scale integrated circuit, particularly a circuit with a large degree of repetitiveness such as a memory chip or a programmable logic array. The dimensional units are in terms of the critical dimension (CD—smallest resolved image dimension) which is defined in the semiconductor industry roadmap. The industry goals for the CDs are 130 nm in 2003 and 100 nm in 2006. For easy comparison, the modeling examples given herein are all for the 130-nm CD generation. The pattern consists of staggered bars each $1\times2$ $CD^2$. The repetitive cell is demarked by the dotted lines and is $6\times6$ $CD^2$. For a periodic pattern, all of the spatial frequency components are harmonics of the fundamental frequencies of this pattern, e.g. $f_x=n/L_x$; $f_y=m/L_y$, where $f_x(f_y)$ are the spatial frequencies in the x (y) direction, n (m) is an integer and $L_x=L_y=6$ CD is the repeat distance in each direction. This pattern is only introduced to illustrate the general concepts of the invention and is not intended to restrict its applicability to only this or substantially similar patterns.

The goal of the lithography process is typically to reproduce this pattern in the developed resist profile with as high a fidelity as possible. FIGS. 2A and 2B show the exemplary pattern achieved when a mask with the required pattern is used in a conventional imaging optical lithography system in the limits of both incoherent (FIG. 2A) and coherent (FIG. 2B) illumination. For incoherent illumination the resultant pattern is shortened and significantly rounded appearing almost circular rather than rectangular; for coherent illumination only the zero-frequency Fourier component (constant intensity across the die) is transmitted by the lens for this particular pattern, wavelength and NA combination and there is substantially no image at all. State-of-the-art lithography tools often use partially coherent illumination which is in some ways better than either of these two limits; but still shows many of the same limitations. Optics can, in principle, support spatial frequencies up to a maximum spatial frequency of $2/\lambda$. Various techniques, including multiple interferometric exposures, can almost eliminate the lens limitations on spatial frequencies and approach the fundamental limit of a linear optical system.

FIG. 3 shows the modeling results for imaging the pattern of FIG. 1 including all of the spatial frequencies available at an imaging wavelength of 365 nm (I-line). While the image is significantly closer to the desired pattern than the incoherent imaging results, there is still significant rounding of the corners of the printed features due to the unavailability of the spatial frequencies needed to provide sharp corners. That is, the magnitudes of the spatial frequencies necessary to define these corners are greater than $2/\lambda$, the limit of a linear optical system. One approach to improving upon this problem is typically to decrease the wavelength, thereby increasing the maximum available spatial frequency. Decreasing the wavelength has often been a traditional industry solution to the need for defining smaller and smaller features. However, for the reasons cited above, it is likely that this solution cannot be exploited much beyond the 193-nm ArF excimer laser source wavelength.

The use of the nonlinear response of photoresist to substantially sharpen developed photoresist patterns in the z-direction, through the thickness of the resist, has long been understood [see, for example, *Introduction to Microlithography, Second Edition*, L. F. Thompson, C. G. Willson and M. J. Bowden, eds. (Amer. Chem. Soc. Washington D.C., 1994, pp. 174–180)]. To aid in understanding this process, many approaches exist for modeling the photoresist response. Industry-standard modeling codes, such as PROLITH™ and SAMPLE, typically take into account the many subtle effects that are often necessary to accurately model the lithography process. However, for the present purposes, a simpler model, first presented by R. Ziger and C. A. Mack [Generalized Approach toward Modeling Resist Performance, AIChE Jour. 37, 1863–1874 (1991)], typically provides a good approximation. This model describes the photoresist thickness, t(E), after the photoresist develop step substantially resulting from a given optical exposure fluence (typically normalized to a clearing fluence) E by the relationship:

$$t(E) = 1 - \left(\frac{1 - e^{-E}}{1 - e^{-1}}\right)^n \quad (1)$$

where n is a parameter that characterizes the contrast of the resist. For typical novolac-based photoresist commonly used for I-line wavelengths, n~5–10. FIG. 4 shows a plot of t(E) vs. E showing the strong nonlinearity often associated with the photoresist process. In order to make the mathematics simpler, the modeling presented herein uses a simple thresholding step function approximation to τ(E) shown, for example, by the dotted line in FIG. 4. This approximation substantially retains the essential features of the photoresist response without introducing unnecessary computational complexity into the modeling. A more complete modeling effort can be created by one of ordinary skill in the art.

For a simple two-beam interference, the fluence profile is given by the expression:

$$E(x) = 1 + \cos(4\pi\sin(\theta)x/\lambda). \quad (2)$$

The Fourier transform consists of three components, a unity amplitude, zero frequency term and two components with amplitude ½ at ±2 sin $(\theta)/\lambda$ [$F(E) = \delta(f_x) + \frac{1}{2}(\delta(f_x + 2 \sin (\theta)/\lambda) + \delta(f_x - 2 \sin (\theta)/\lambda))$], where F represents the Fourier-transform operator and $f_x$ is the spatial frequency. After passing this function through the nonlinear filter of the photoresist, represented by τ(E), the resulting thickness of the photoresist is typically a substantially rectangular function and the Fourier transform is typically a substantially sinc (sin (x)/x) function sampled at harmonics of the pitch, $f_n = 2n \sin (\theta)/\lambda$:

$$\tau[E(x)] = \frac{a}{2} \sum_{n=-\infty}^{\infty} \left[ \frac{\sin\left(\frac{2\pi n a \sin(\theta)}{\lambda}\right)}{\frac{2\pi n a \sin(\theta)}{\lambda}} e^{i 4\pi n x \frac{\sin(\theta)}{\lambda}} \right] \quad (3)$$

Examples of these one-dimensional real space and spatial frequency space results are shown in FIGS. 5A and 5B respectively.

FIG. 5C shows an experimental realization of this sharpening in the z-direction. This result was obtained using two coherent beams from an Ar-ion laser ($\lambda$=364 nm) incident on a photoresist-coated wafer at angles ±θ of approximately 30° corresponding to a pitch of about 360 nm. A standard I-line photoresist was used with a thickness of about 0.5 µm. An antireflective coating (ARC) layer was included under the photoresist to eliminate the standing wave effects that often occur as a result of the substantial reflectivity at the photoresist/Si interface. The developed photoresist features exhibit substantially vertical sidewalls. The Fourier transform of this pattern contains high spatial frequency components that go well beyond the $2/\lambda$ linear systems limit of optics as is illustrated in FIG. 5B.

While the nonlinearity often substantially sharpens the profile in the z-direction, it does not, however, usually add additional frequency components in the x-y plane. In fact, the profiles of FIGS. 2 and 3 were calculated using this same photoresist filter, thus demonstrating the lack of frequency components in the x-y plane. Moreover, multiple exposures in the same level of photoresist without any additional processing result in summing the amplitudes and phases of the spatial frequency components contained within each exposure. Consequently, applying and developing the photoresist after this summation again usually sharpens the photoresist vertical profiles but does not often substantially change the 2-D cross section at the threshold level. Mathematically, this is represented as:

$$T(x, y) = \tau\left(\sum_n E_n(x, y)\right) \quad (4)$$

where T(x,y) is the photoresist thickness as a function of the wafer plane Cartesian coordinates x and y and $E_n(x,y)$ is the fluence of the $n^{th}$ exposure at the position (x,y).

A simple two exposure situation involving only two beam exposures can serve as a typical example of the prior art. The first exposure writes a periodic pattern in the x-direction as in Eq. 4, and the second exposure writes a periodic pattern at ½ the x-pitch in the y-direction. FIG. 6A shows the results of a simple double exposure, as taught in U.S. Pat. No. 5,415,835—S. R. J. Brueck and Saleem Zaidi, Method and Apparatus for Fine-Line Interferometric Lithography (issued May 16, 1995) which is herein incorporated by reference. The parameters of the calculation are set for a CD of about 130 nm and a small pitch of about 260 nm. Because the intensities are added before the thresholding operation is applied, the resulting shapes exhibit significant rounding of the corners and are substantially elliptical rather than rectangular.

SUMMARY OF THE INVENTION

The present invention extends the available spatial frequency content of an image through the use of a method and apparatus for combining nonlinear functions of intensity of at least two individual exposures to form three dimensional patterns with spatial frequencies that are not present in any of the individual exposures and that extend beyond the limits set by optical propagation of spatial frequencies whose magnitudes are $\leq 2/\lambda$ in all three spatial directions. This extension of spatial frequencies preferably extends the use of currently existing photolithography capabilities, thereby resulting in a significant economic impact. Extending the spatial frequency range of lithographically defined structures suitably allows for substantial improvements in, inter alia, crystal growth, quantum structure growth and fabrication, flux pinning sites for high-$T_c$ superconductors, form birefringent materials, reflective optical coatings, photonic crystals, electronics, optical/magnetic storage media, arrays of field emitters, DRAM (Dynamic Random Access Memory) capacitors and in any other applications requiring large areas of nm-scale features.

A first exemplary embodiment uses two photoresist layers sensitive at different wavelengths. Additional layers are often required in a multi-level photoresist process to protect against interdiffusion of the various photosensitive materials. Alternatively, a hard mask (e.g. $SiO_2$ or $Si_3N_4$ or any other suitable film material) is used with additional processing between exposures. In either case, a first lithographic pattern at a first wavelength regime is suitably exposed into the first photosensitive layer and a second lithographic pattern in a second wavelength regime is suitably exposed into the second photosensitive layer. Upon suitable development and/or processing the result is a layering of the two lithographic patterns in the two layers and/or in the hard mask layer. These layers in combination are used as masks for further processing of the underlying wafer to transfer a pattern that is the product of the two masks into the underlying materials. Image reversal offers the possibility of combining the two exposures in the same level of photoresist with intermediate processing steps to assure independent thresholding nonlinearities.

A second exemplary embodiment of combining nonlinear processes preferably includes the following steps: 1) deposit a suitable hard mask material and a photoresist layer onto the film stack to be patterned; 2) suitably expose and develop a periodic pattern (at pitch $p_{min} \geq \lambda/2$ and with CD $\leq \lambda/8$) in the photoresist using interferometric lithography; 3) transfer this pattern into the hardmask by etching; 4) suitably remove the remaining photoresist; and 5) repeat the above steps at the same pitch, but with the pattern offset by $p_{min}/2$ to interpolate new features midway between the previously defined features in the hardmask. This procedure typically results in a pattern with ½ the pitch of the original structure. Alternatively, this procedure may be repeated a number of times, with appropriate offsets and CDs to produce a pitch $p_{min}/N$, where N=1 (original pattern), N=2 (one additional exposure and processing sequence), N=3 (two additional exposures and processing sequences), and so on. Structures with linewidths as much as a factor of 40 less than the pitch for larger pitches (0.05-μm wide line on a 2 μm pitch) have been suitably produced [see, X. Chen et al., SPIE 1997].

In an alternative embodiment, this technique can be extended to two-dimensional patterning by using either multiple exposures and/or multiple-beam single exposures. For a grid of holes or posts with equal pitches, $p_1$, in both the x- and y-directions, a second exposure at the same pitch but shifted by $p_1/2$ in x and $p_1/2$ in y decreases the pitch (now $p_2$) to approximately $p_2=p_1/\sqrt{2}$. With two further exposures a new pitch (now $p_3$) of approximately $p_3=p_1/2$ is achieved.

BRIEF DESCRIPTION OF THE DRAWINGS FIGURES

The subject invention will be hereinafter described in conjunction with the appended drawing figures, wherein like numerals denote like elements, and:

Figure 6A:
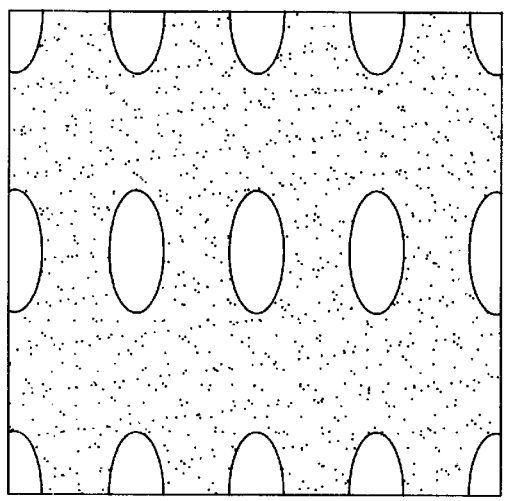
Figure 6B:
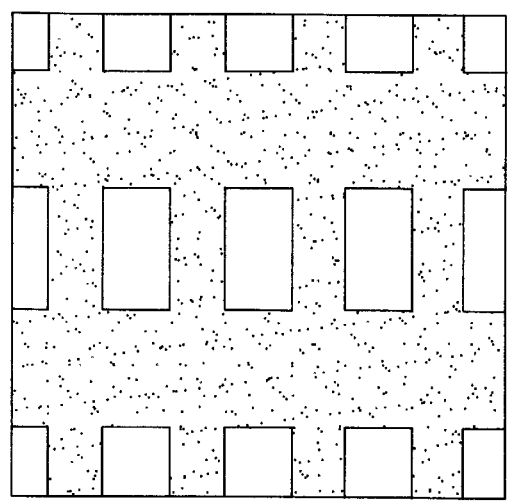
Figure 7A:
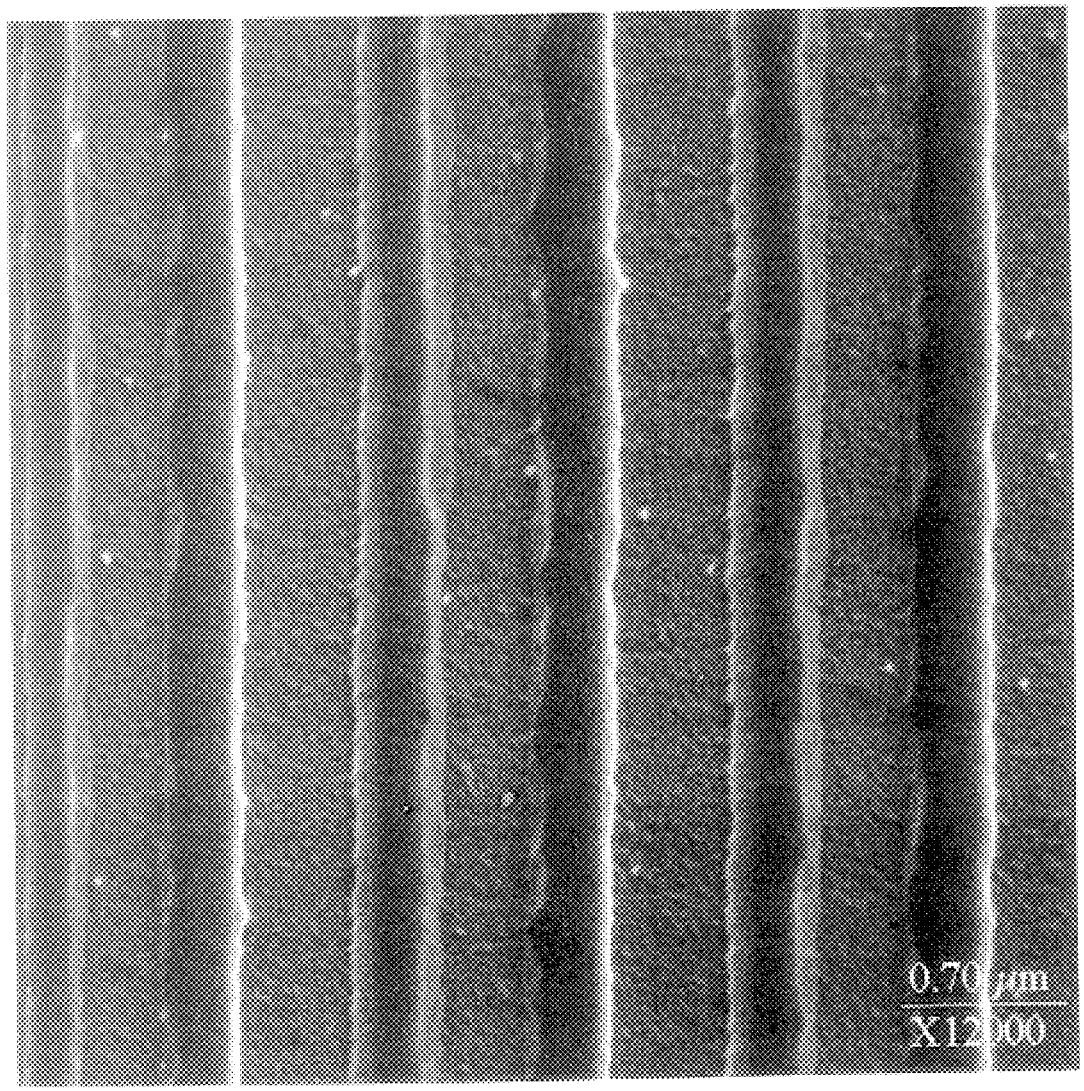
Figure 7B:
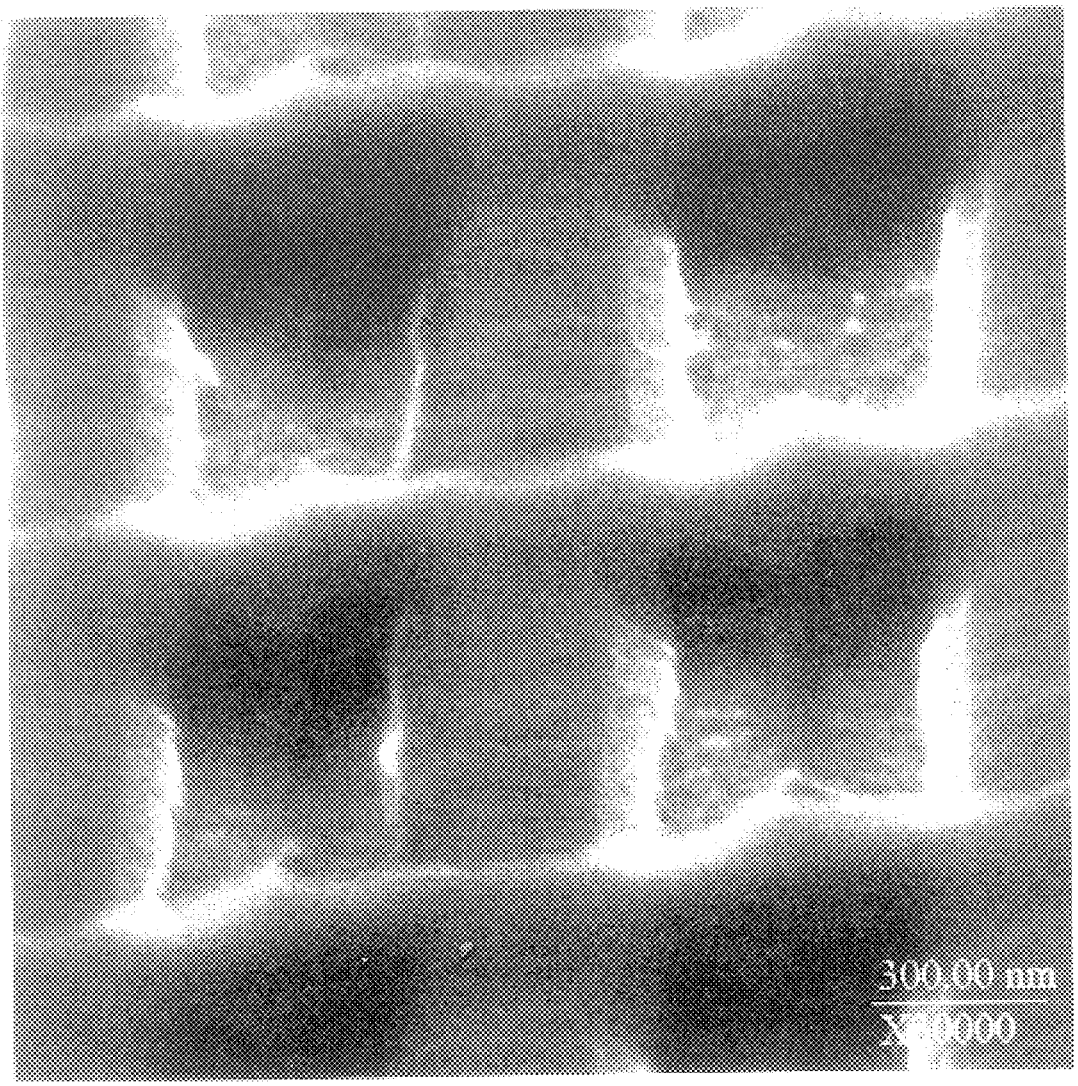

FIG. 6A shows model results for the photoresist pattern created by two two-beam interferometric lithography exposures oriented at right angles to each other with the x-direction pitch ½ of that of the y-direction created by the prior art process where the two exposures are summed in a single layer of photoresist which is subsequently developed, providing a thresholding nonlinearity that sharpens the resist sidewalls but does not modify any additional spatial frequencies in the x-y plane;

FIG. 6B shows model results for the photoresist pattern created by two interferometric lithography exposures with the x-direction pitch ½ of that of the y-direction created by applying thresholding nonlinearities to each exposure individually and multiplying the thresholded images to get the final image;

FIG. 7A–7B shows an experimental demonstration of the multiplication of two masks corresponding to two thresholded images. FIG. 7A shows an exemplary result of a two-beam interferometric exposure (line:space pattern) that has been transferred to a sacrificial $Si_3N_4$ layer by etching after exposure and development of the first exposure. FIG. 7B shows an exemplary result after depositing a second photoresist layer, exposing this second layer with a second interferometric exposure substantially at right angles to the first exposure, and developing the second photoresist layer.

Figure 1:
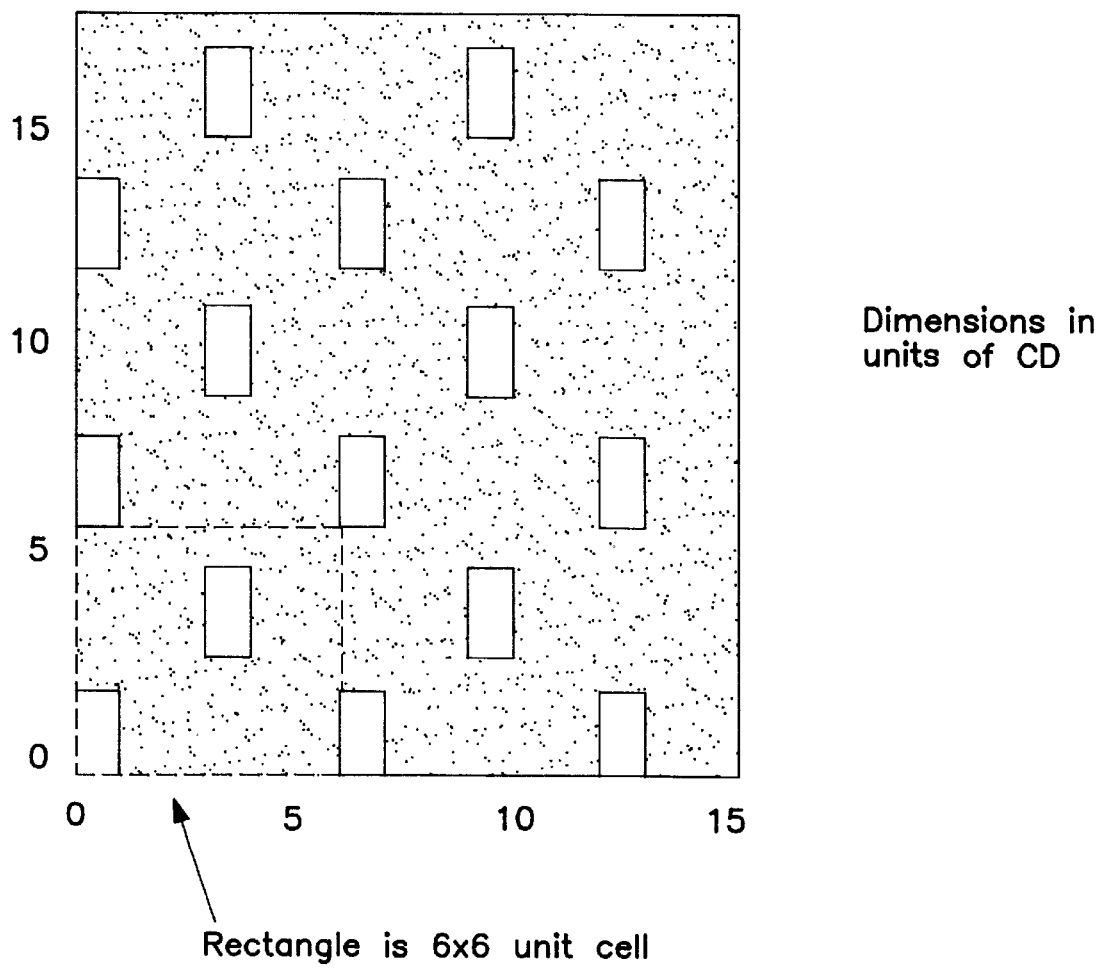
FIG. 1 shows a prototypical array structure (that could be part of a memory chip or programmable logic array) having a grid in units of critical dimensions (CD) which vary for each generation and a repeating cell.
Figure 2A:
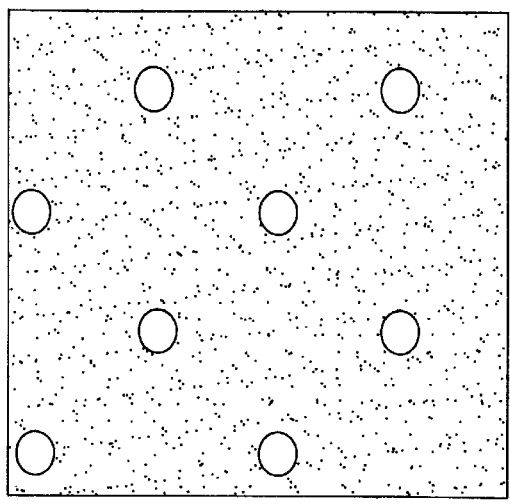
FIGS. 2A and 2B show exemplary modeling results for the two limits of incoherent (FIG. 2A) and coherent (FIG. 2B) illumination using an optical system consisting of an industry-standard I-line (365 nm) lithography tool with a 0.5 numerical aperture (NA) lens to print the pattern of FIG. 1 for a 130-nm CD.
Figure 2B:
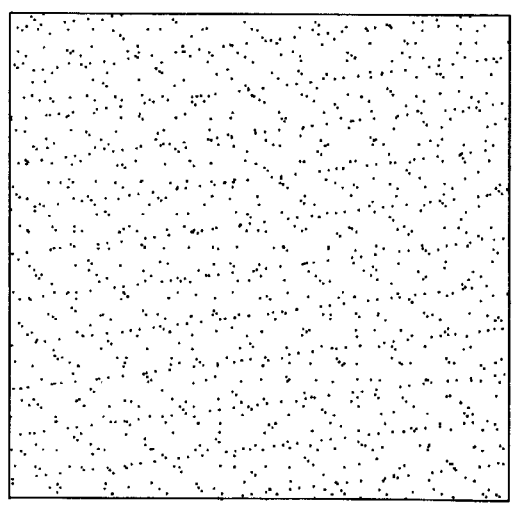
Figure 3:
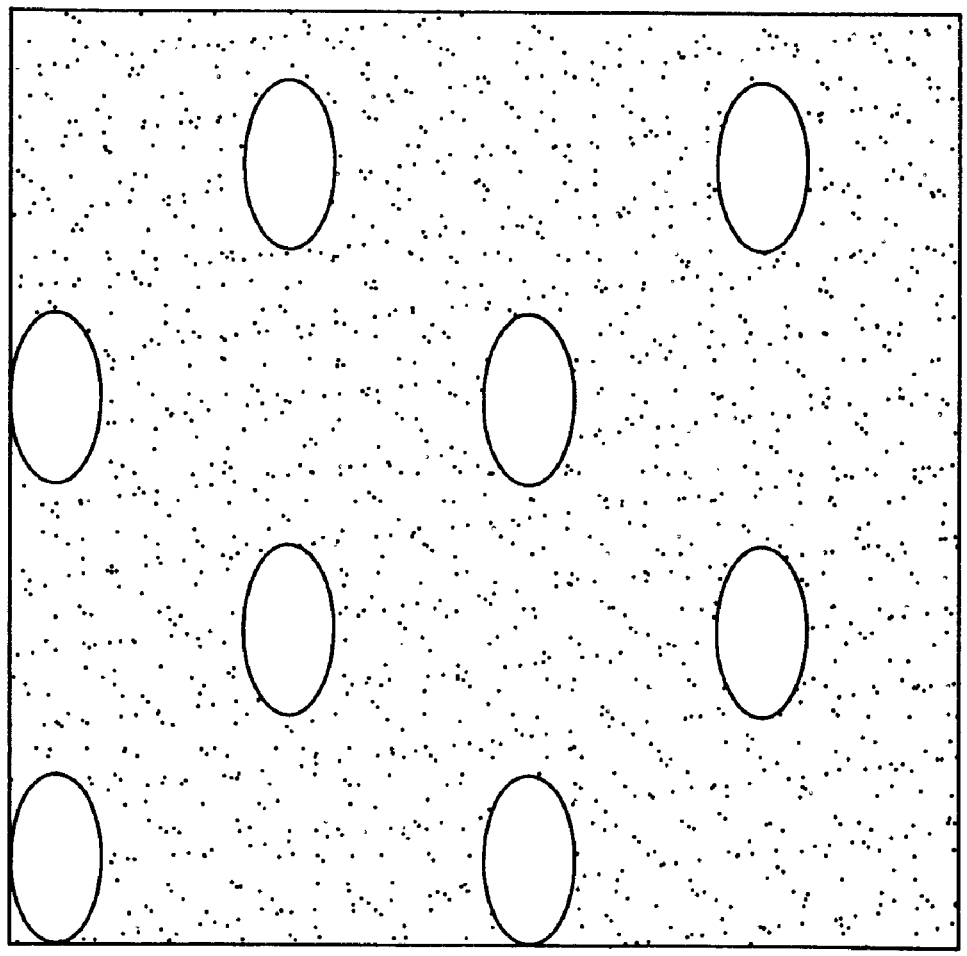
FIG. 3 shows modeling results (I-line wavelength and 130 nm CD) using all of the spatial frequencies available to a linear optical system (to a magnitude of $2/\lambda$)
Figure 4:
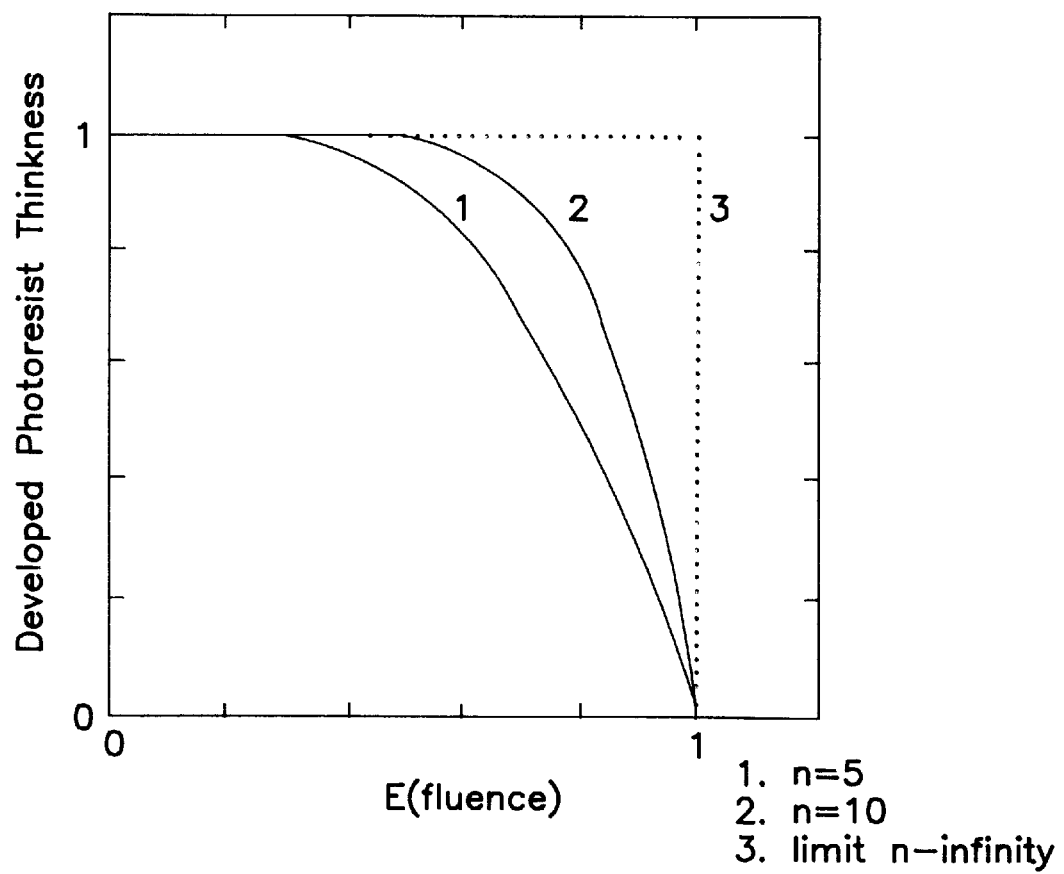
FIG. 4 shows an exemplary graph of nonlinear response of the photoresist thickness on exposure fluence with two approximations 1) the model of Ziger and Mack, t(E) with n=5 and with n=10, typical of the range of commercially available novolac resists at I-line; and 2) a simplified step function model τ(E)
Figure 5A:
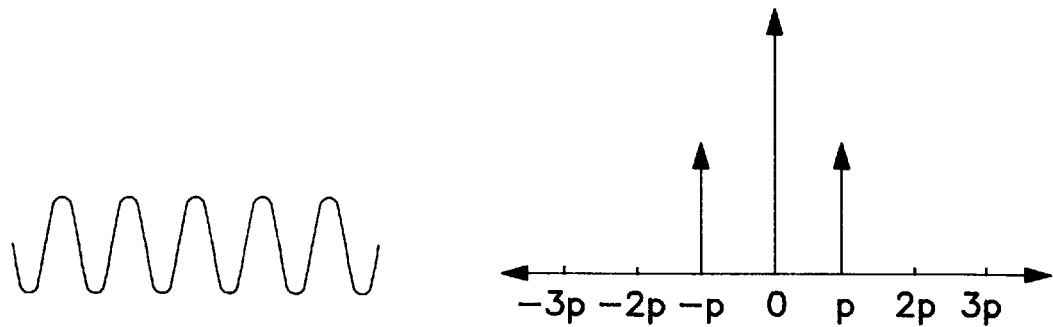
FIGS. 5A and 5B show real space (FIG. 5A) and spatial frequency space (FIG. 5B) patterns for a simple two-beam interference for the aerial image and the resulting photoresist profile after the nonlinear thresholding response of the photoresist.
Figure 5B:
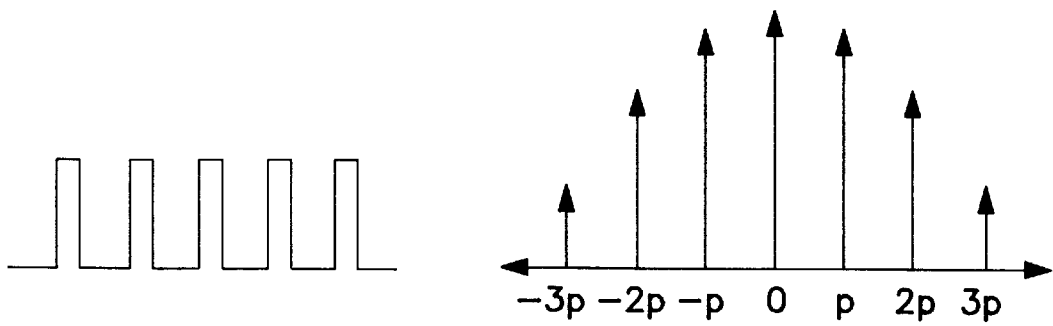
Figure 5C:
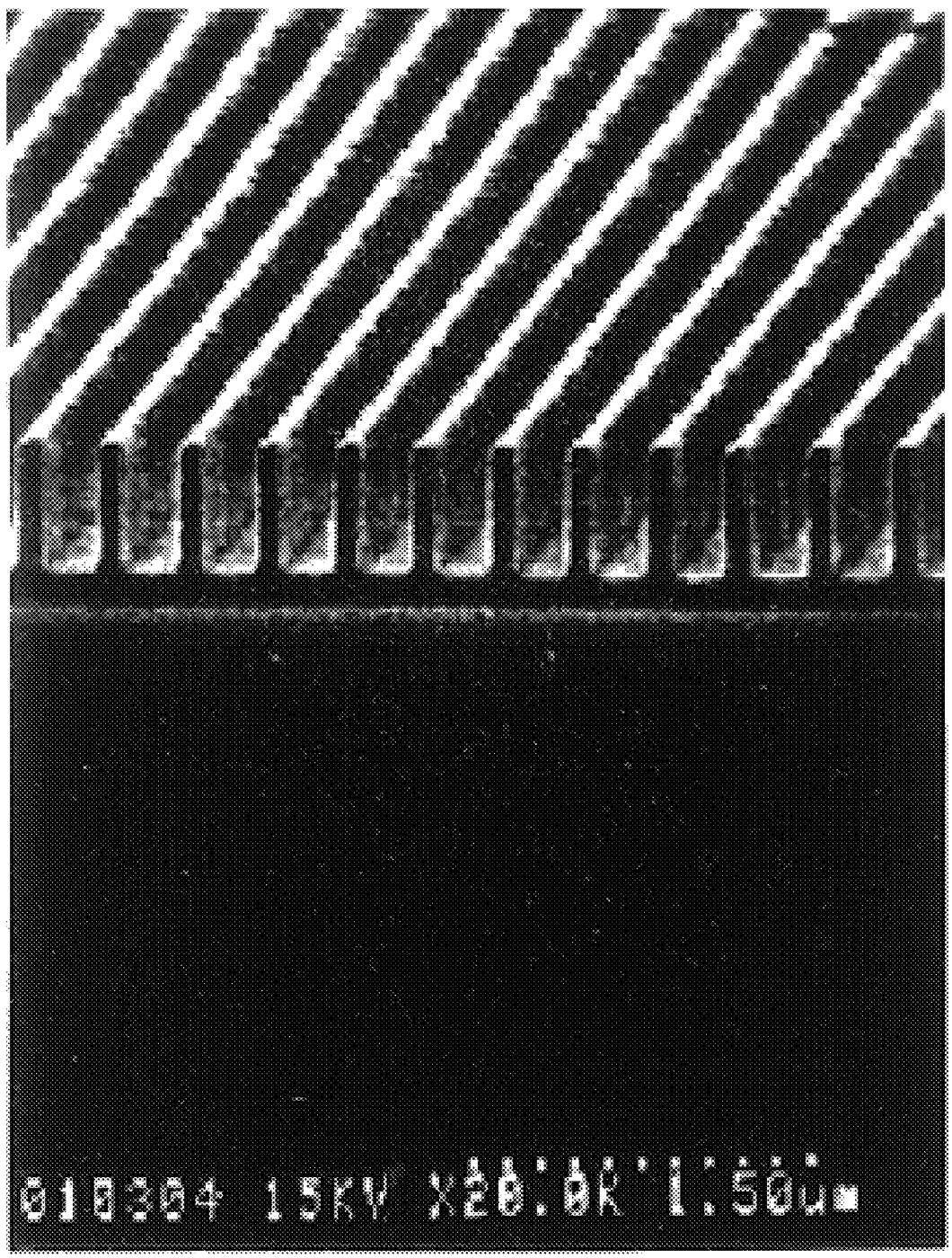
FIG. 5C shows an exemplary cross section scanning electron micrograph of a line:space pattern resulting from developing a two beam interference exposure that illustrates the nonlinear response of the photoresist.
Figures 8A, 8B:
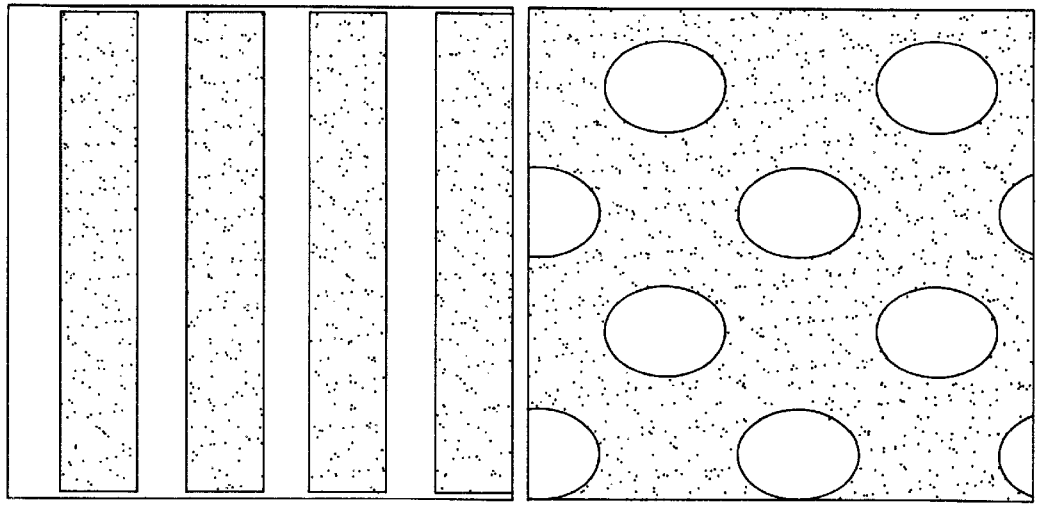
Figure 8C:
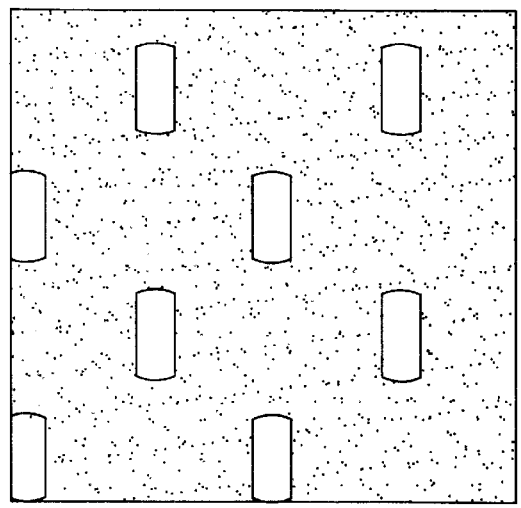

FIGS. 8A–8C show the application of the present invention to the prototypical pattern of FIG. 1 wherein FIG. 8A shows the result of a simple two-beam interferometric exposure, FIG. 8B shows the result of an incoherently illuminated imaging optical exposure (NA=0.6@365 nm) and FIG. 8C shows the result of multiplying the two images using a combined mask.

Figure 9A:
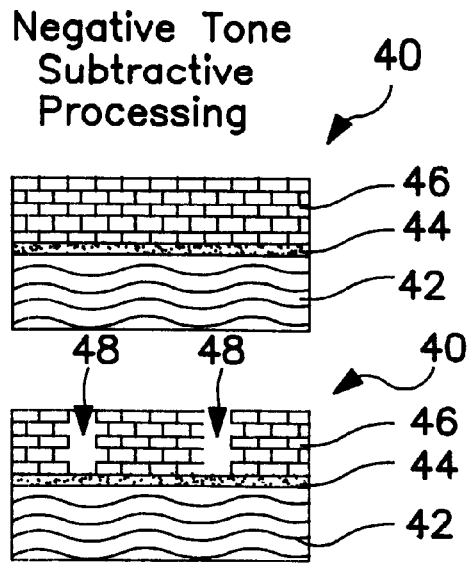
Figure 9C:
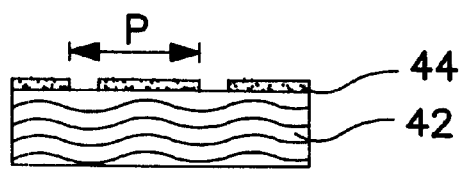
Figure 11A:
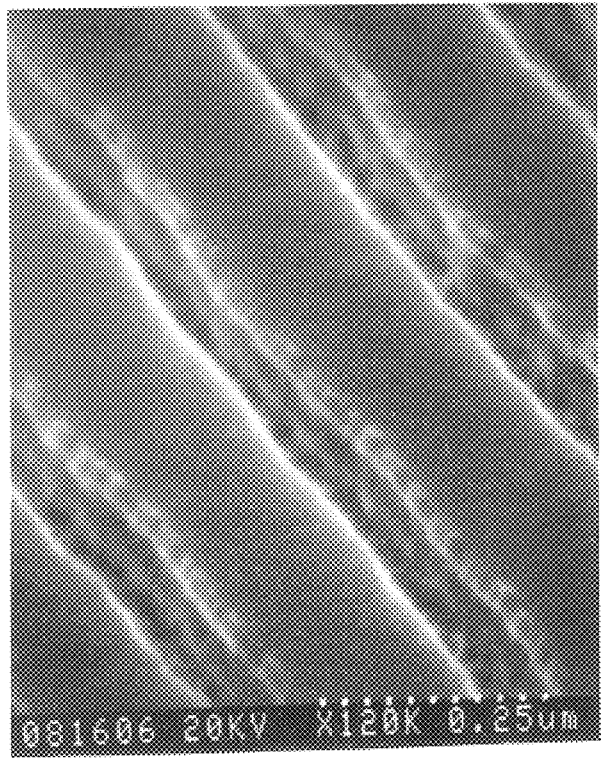

FIGS. 9A–9E show a preferred embodiment of a process, using a negative photoresist, that results in a factor of two reduction in the pitch in accordance with the present invention;

FIGS. 10A–10F show a preferred embodiment of a process, using a positive photoresist, that results in a factor of two reduction in the pitch in accordance with the present invention;

FIG. 11A shows an exemplary SEM after the first etch, as demonstrated in FIG. 9C, with a pitch of approximately 260 nm in accordance with the present invention.

Figure 11B:
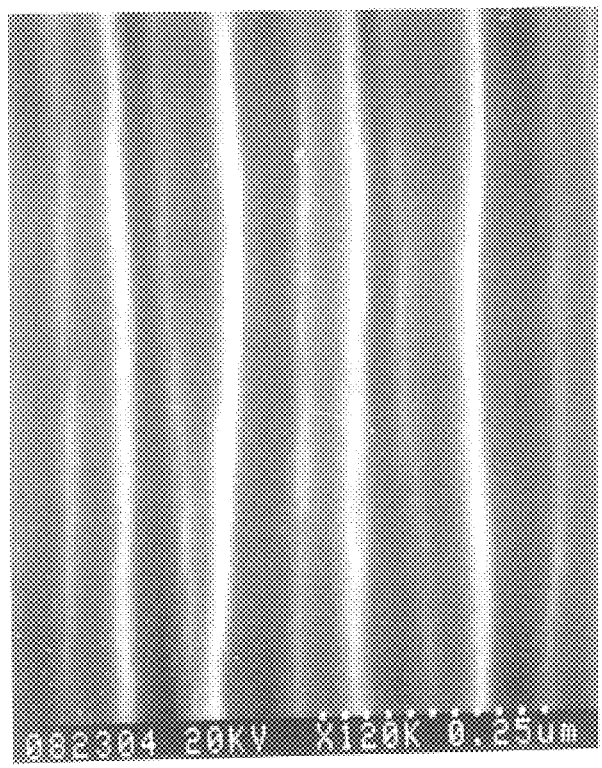
Figure 11C:

FIG. 11B shows exemplary results after the second etch, as demonstrated in FIG. 9F, with the pitch suitably reduced to ~130 nm and the CD to ~60 nm in accordance with the present invention;

FIG. 11C shows exemplary results of an anisotropic KOH etch of 0.13-mm pitch pattern into the Si using the nitride layer as a hard mask in accordance with the present invention;

FIG. 11D shows an exemplary narrow line having superior vertical sidewalls which was produced by very high spatial frequencies achieved from the nonlinearities in accordance with a preferred embodiment of the present invention.

FIG. 11E shows a concept drawing of an exemplary two color separation for a typical SRAM circuit pattern demonstrating the possibilities for using spatial frequency doubling to enhance the pattern density.

Figure 12:
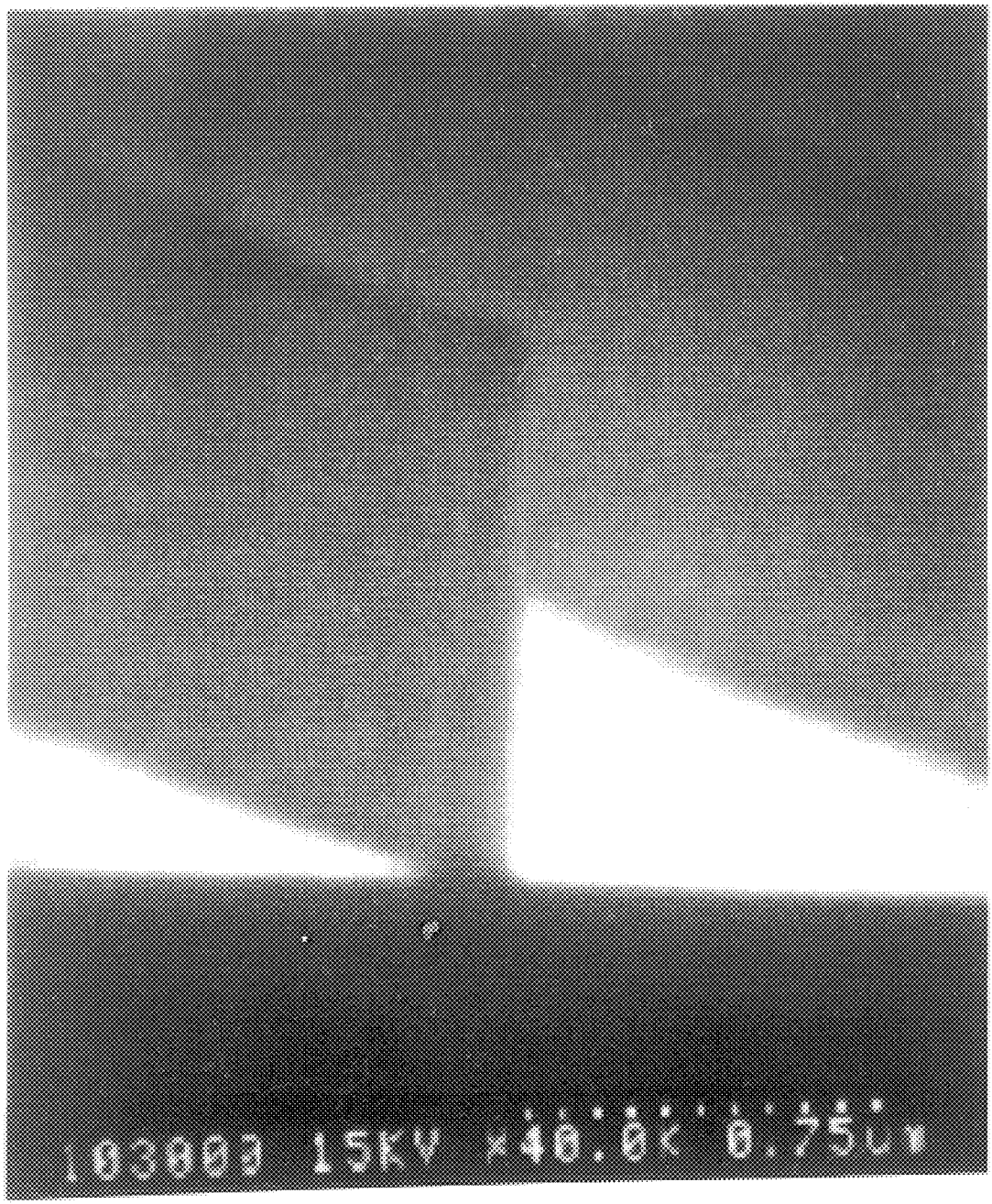
Figure 13A:
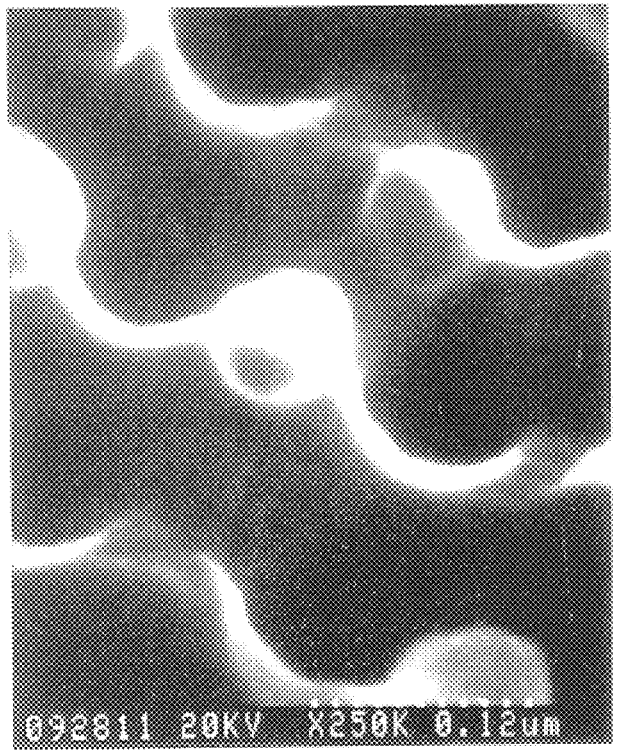
Figure 13B:
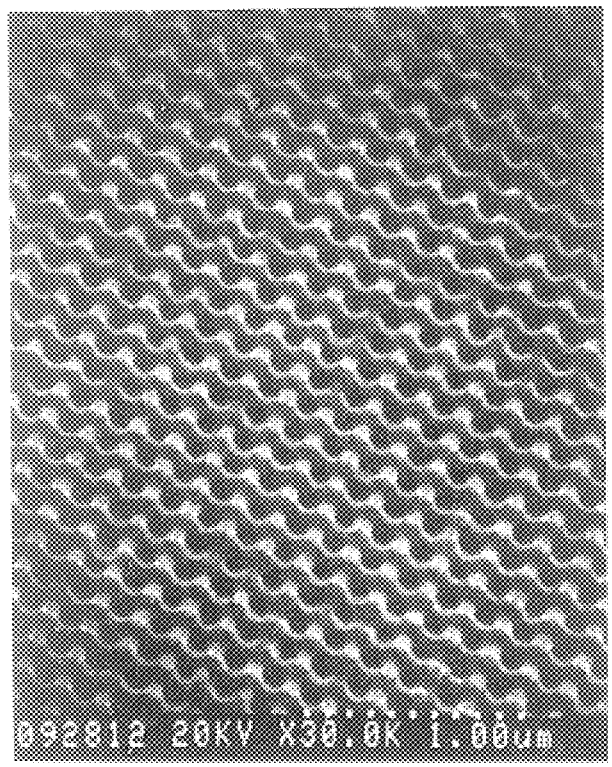
Figure 14:
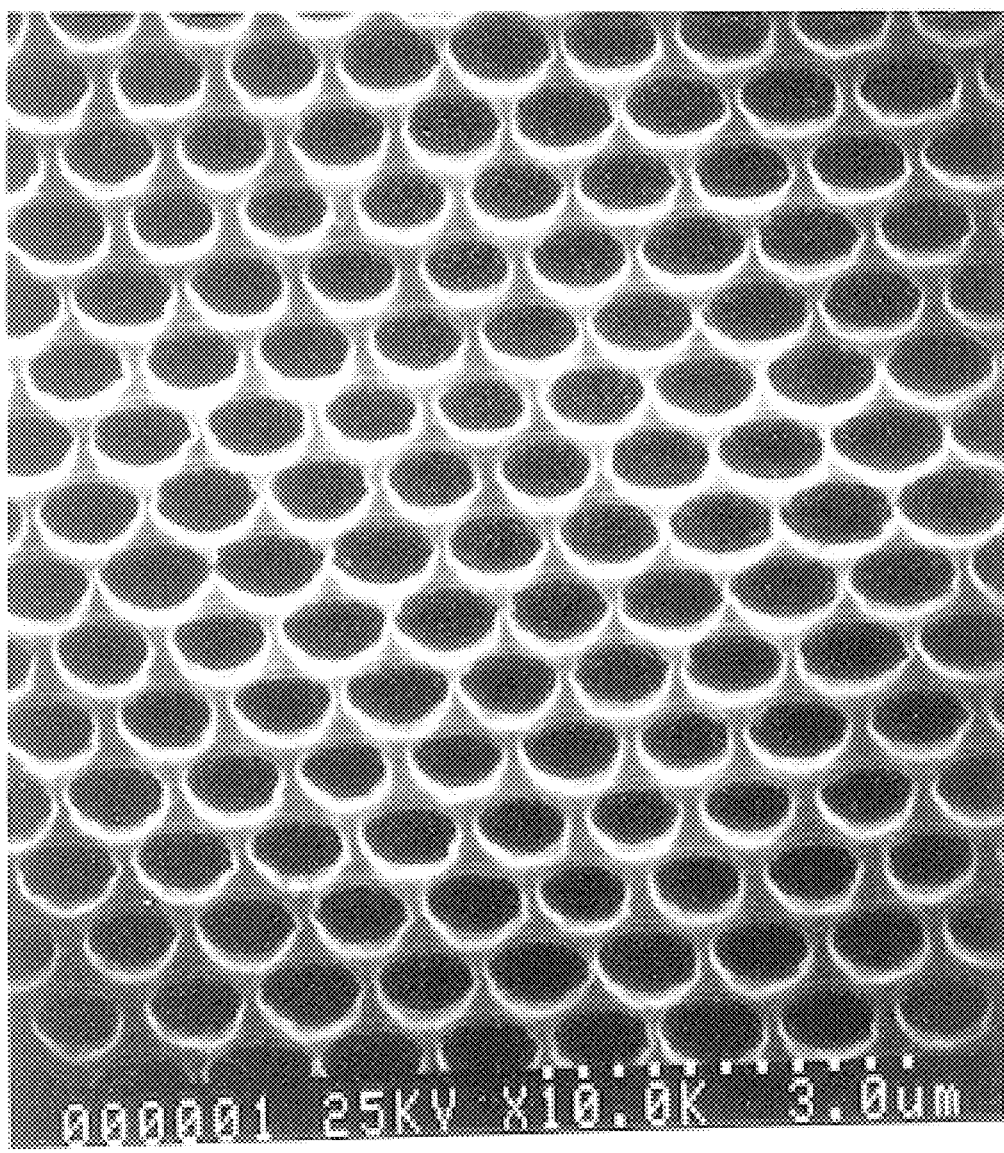
Figure 15:
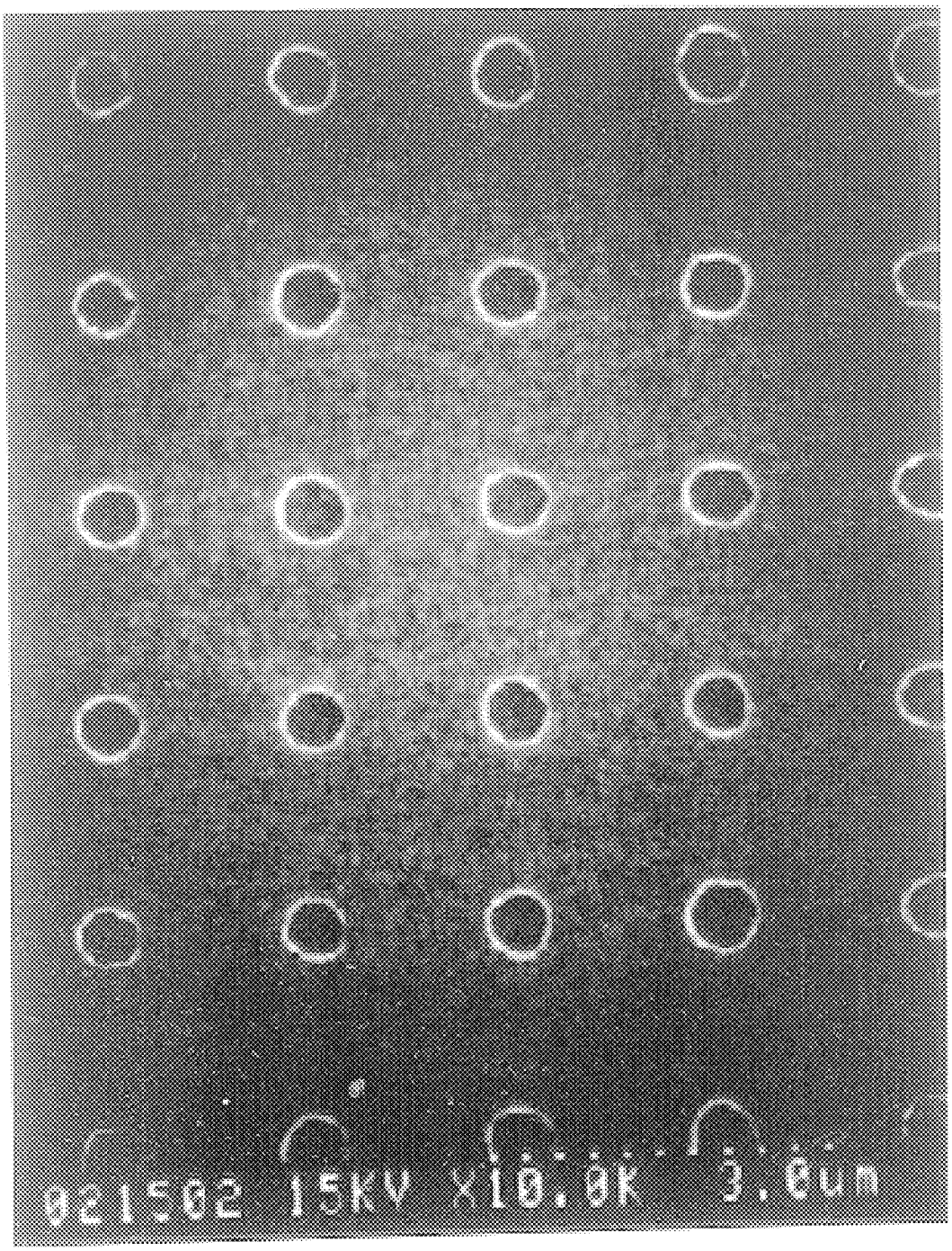
Figure 16:
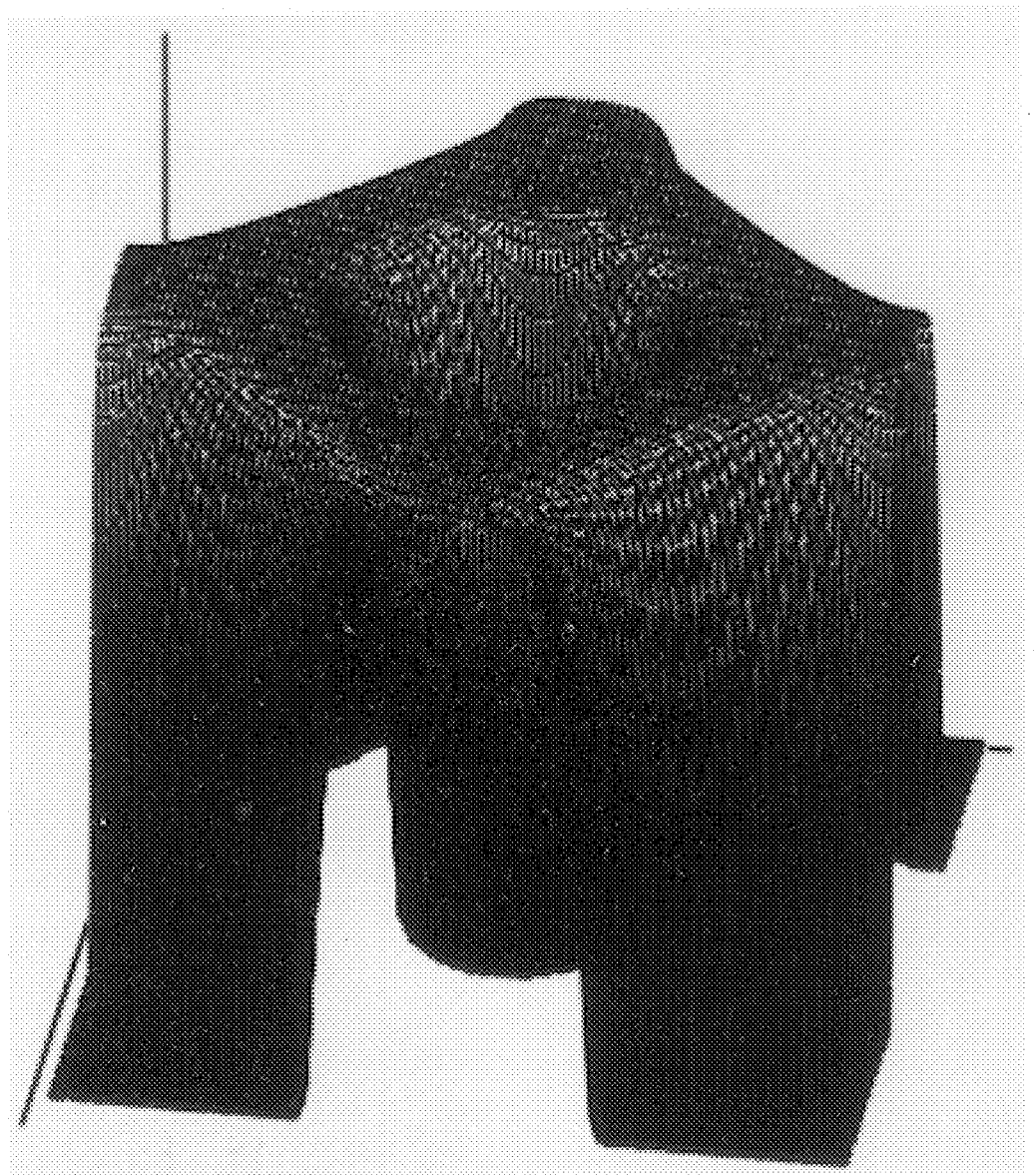

FIG. 12 shows an exemplary result of a multiple exposure technique including a 0.05-$\mu$m wide photoresist line on a 2-$\mu$m pitch, a line:space ratio of 1:10 in accordance with a preferred embodiment of the present invention;

FIG. 13 shows an example of two-dimensional patterning with a dense array of 90-nm diameter holes defined in a photoresist layer on a 1 80-nm pitch in accordance with a preferred embodiment of the present invention;

FIG. 14 shows another example of two-dimensional patterning with a dense, hexagonal close packed pattern written with three two-beam exposures and the wafer rotated 120° between exposures in accordance with a preferred embodiment of the present invention;

FIG. 15 shows an exemplary 2-D hole pattern written with a five-beam geometry in a single exposure in accordance with a preferred embodiment of the present invention;

FIG. 16 shows an exemplary calculation of the structures obtained with the five-beam geometry of FIG. 16 when the exposure flux is increased to form an array of posts rather than the array of holes.

DETAILED DESCRIPTION OF PREFERRED EXEMPLARY EBODIMENTS

The present invention preferably employs nonlinear processes either in the photoresist intensity response and/or in additional processing steps in order to create high spatial frequencies, beyond the optical propagation limit of 2/$\lambda$, in a pattern produced on a suitable thin-film layer on a wafer that is used, in subsequent process steps, to transfer the structures containing the high spatial frequencies in the plane of the wafer into the underlying film structure. In a preferred embodiment, two (or more) exposures are individually subjected to thresholding nonlinearities, then the images are preferably combined (added or multiplied) resulting in a pattern containing additional spatial frequencies that are not substantially present in any of the individual images. Mathematically, the specific embodiment of multiplication is equivalent to:

$$T(x, y) = \tau[E_1(x, y)] \times \tau[E_2(x, y)] \times ... \tau[E_n(x, y)] \quad (4)$$

$$= \mathcal{F}^{-1}\{\mathcal{F}[\tau[E_1(x, y)]] \otimes ... \mathcal{F}[\tau[E_n(x, y)]]\}$$

where the $\otimes$ represents a convolution operation. In like manner, the embodiment of addition is represented mathematically by:

$$T_{add}(x, y) = \tau[E_1(x, y)] + \tau[E_2(x, y)] + ... \tau[E_n(x, y)] \quad (5)$$

$$= \mathcal{F}^{-1}\{\mathcal{F}[\tau[E_1(x, y)]] + ... \mathcal{F}[\tau[E_n(x, y)]]\}$$

The thresholding operation suitably results in high spatial frequencies in the final images; the convolution operator suitably results in a final image with spatial frequencies corresponding to substantially all possible combinations (sum and difference) of the frequencies in the individual images. In a preferred embodiment, the thresholding nonlinearity results in frequency components extending beyond the capabilities of an optical system (e. g. frequencies >2/$\lambda$. Moreover, the multiplication operation preferably extends results in components extending into parts of frequency space that are not substantially addressed by the individual exposures.

In contrast to the prior art methods which typically yield rounded corners on the structures as shown in FIG. 6A, the present invention suitably yields the patterns shown in FIG. 6B, namely rectangles with sharp, well-defined corners. The patterns of FIG. 6B are preferably formed in accordance with the present invention by suitably applying the thresholding nonlinearity individually to each exposure and multiplying. Mathematically, the resulting spatial frequency transform is preferably the product of appropriate [sin $(f_x a_x)/f_x a_x$] and [sin $(f_y a_y)/f_y a_y$] functions which yields the spatial Fourier transform of the desired rectangular pattern, viz:

$$T(x, y) = \tag{6}$$

$$\tau[E_1(x)] \times \tau[E_2(y)] = \frac{a_x a_y}{4} \sum_{n=-\infty}^{\infty} \left[ \frac{\sin\left(\frac{2\pi n a_x \sin(\theta_x)}{\lambda}\right)}{\left(\frac{2\pi n a_x \sin(\theta_x)}{\lambda}\right)} e^{i\frac{4\pi n x \sin(\theta_x)}{\lambda}} \right] \times$$

$$\sum_{n'=-\infty}^{\infty} \left[ \frac{\sin\left(\frac{2\pi n' a_y \sin(\theta_y)}{\lambda}\right)}{\left(\frac{2\pi n' a_y \sin(\theta_y)}{\lambda}\right)} e^{i\frac{4\pi n' y \sin(\theta_y)}{\lambda}} \right]$$

FIGS. 7A–7B show an experimental realization of this pattern. A Si wafer was coated with a thin $Si_3N_4$ film and with a first photoresist layer. A two-beam interferometric exposure was used to define a line:space array in this first photoresist layer. The pattern was developed, transferred into the nitride film, and the remaining photoresist removed. An exemplary resulting pattern in the nitride layer is shown in FIG. 7A. A second photoresist layer was then applied to the wafer and a second two-beam interferometric exposure, substantially at right angles to the first exposure pattern, was suitably applied and developed. FIG. 7B shows an exemplary resulting pattern: the vertical lines are in the nitride, the horizontal lines are in the second photoresist layer. Together the two mask patterns provide a multiplication of the individual images that have been operated on independently with the nonlinear thresholding responses of the two photoresist layers. The composite mask pattern shows substantially right angles at the corners as predicted by Eq. 6 and in FIG. 6B.

FIGS. 8A–8C show exemplary results from a similar calculation for the prototypical array structure of FIG. 1. FIG. 8A shows an exemplary result of suitably applying a thresholding nonlinearity to a simple two-beam interferometric lithography exposure with a CD of 130 nm and a pitch of 260 nm. FIG. 8B shows an exemplary pattern obtained from a conventional (incoherent illumination) optical lithography exposure of the mask corresponding to FIG. 1 [I-line (365 nm) exposure wavelength and 0.5 NA lens]. While the optical exposure typically cannot substantially resolve the 130-nm CD structures, it does provide information that can be used to suitably restrict the extent of the interferometric exposure which exists over the entire field. Finally, FIG. 8C shows an exemplary result of multiplying the two patterns to get the final result, thereby showing the dramatic improvement in the profiles. This example preferably involves a combination of an interferometric lithography exposure and an imaging optical exposure, while the prior example consisted of two interferometric lithography exposures.

As mentioned, the present invention relates to the use of nonlinear processing suitably combined with multiple exposures to extend the range of spatial frequencies beyond those available with conventional single or additive exposure techniques. In implementing the nonlinear processing and multiple exposures, the present invention preferably incorporates any suitable combination of interferometric lithography, imaging optical and/or other exposure techniques. Thus, a number of processing sequences exist that are preferably used to achieve this sequential thresholding of each exposure and multiplication of the resulting patterns.

In a preferred embodiment, a sacrificial layer, such as, for example a $SiO_2$ or $Si_3N_4$ layer, is used with additional processing between the two exposures. More particularly, following a suitable interferometric lithography exposure and develop of a first pattern in a first photoresist layer, the resulting pattern is transferred into the sacrificial layer by a suitable etching step. Any remaining photoresist from the first photoresist layer is then removed and the wafer is then preferably coated with a second photoresist layer and a second exposure and develop sequence is suitably carried out to transfer a second pattern into this second photoresist layer. In an alternative embodiment, this second exposure is an imaging optical exposure. A second etch step is preferably carried out to transfer the combined pattern into the underlying wafer layers. The second etch step preferably uses a combined etch mask, parts of which are preferably comprised of the nitride layer and parts of which are comprised of the undeveloped photoresist layer. Thus, in a preferred embodiment, the combined etch mask provides the multiplication operation. Finally, the remaining mask layers, both photoresist and sacrificial material, are preferably removed. While the aforementioned exemplary process is set forth, it will be appreciated by one of ordinary skill in the art of semiconductor processing that many variants on this basic process exist. For example, in an alternative embodiment, an additive step, such as deposition and lift-off, is suitably used in place of one or another of the etch steps recited above. In another alternative embodiment, damascene (etching, deposition and polishing to produce an inlaid structure) processes are incorporated into the process. In another alternative embodiment, in certain process flows, different sacrificial layers, such as, for example metals, poly-Si, polymers and the like, are incorporated into the process.

In practice, to reduce costs, it is typically desirable to reduce the number and complexity of processes necessary to achieve the desired structure. In particular, it is desirable to create the same combination of nonlinearities in a single photolithography sequence without requiring additional etch or deposition steps. To achieve the same combination without additional steps, a preferred embodiment of the present invention incorporates image reversal and/or multilayer resist systems incorporating two exposures [see, for example, *Introduction to Microlithography, Second Edition*, L. F. Thompson, C. G. Willson, M. J. Bowden, eds. Amer. Chem. Soc. Washington, D.C., 25 1994, pp. 184–190, 232–251 and 347–371]. Conventionally, image reversal is often used to create a negative-tone image with a positive resist by exposing the resist (which is specially formulated for image reversal) with a first exposure. The first exposure suitably frees the bound photoactive compound (PAC) in the resist. Depending on the resist formulation, the freed PAC is suitably removed from the resist film with a bake step or an exposure to an appropriate chemical ambient. Next, a second exposure, usually a flood exposure without any spatial information, is suitably used to free the remaining bound PAC in the areas not exposed in the first exposure. Finally, a conventional develop step results in a negative tone image. Multilayer resist systems utilize a similar sequence (expose, process, expose, develop) with the exposure wavelengths chosen to affect specific films within the multilayer resist film stack.

In both processes, the first exposure and intermediate process steps suitably provide a nonlinear response, while the second develop step suitably provides a second nonlinear response. In a preferred embodiment of the present invention, the aforementioned flood exposure step is suitably replaced by a second exposure containing spatial information. In a preferred embodiment, the second exposure is preferably an interferometric exposure. In an alternative embodiment, the second exposure is an imaging optical exposure. The replacement of the flood exposure by a second exposure with spatial information results in the desired sequence of nonlinear steps.

In an alternative embodiment, the combination of nonlinearities is suitably achieved by a multi-layer resist process such as discussed by Willson in the above reference. A photoresist sensitive at longer wavelengths is preferably deposited onto the wafer first, followed by a photoresist sensitive at shorter wavelengths. The layers include any suitable photoresist, but in this embodiment, an I-line resist is used for the bottom layer and a 248-nm resist is used for the top layer. The top resist is preferably selected to be transparent to the I-line wavelength used to expose the bottom resist, and is preferably chosen to be sufficiently absorbing at the 248-nm wavelength to substantially block any light from the exposure at this wavelength from reaching the bottom layer. In an alternative embodiment, a non-photosensitive buffer layer is suitably deposited between the two layers to assist in preserving the integrity of the individual photoresist layers. Consequently, two independent nonlinearities (thresholding) and a layering (multiplication) of the two exposure masks exists. Alternatively, the two sensitivities are suitably combined into a single resist with both positive and negative tonalities, as demonstrated by Hinsberg et al. [W. D. Hinsberg, S. A. MacDonald, L. A. Pederson and C. G. Willson, "A Lithographic Analog of Color Photography: Self-Aligning Photolithography Using a Resist with Wavelength-Dependent Tone," Jour. Imaging Sci. 33, 129–135 (1989).]

In a second preferred embodiment, two nonlinear functions of intensity are added to create spatial frequencies in the final pattern that are not present in either of the individual exposures, resulting in frequency multiplying. More particularly, the use of spatial-frequency multiplied interferometric lithography for the reduction in pitch for the array structure of FIG. 1 will now be described in more detail in FIGS. 9A–9E. FIGS. 9A–9E show a preferred embodiment for a sequence using subtractive fabrication processes that results in an approximate factor of two increase in the spatial period; i.e. a reduction of a factor of two in the pitch. With respect to FIG. 9A, a preferred exemplary structure includes the material 42 in which a pattern is suitably formed, a thin layer 44 of a material which suitably forms a hard mask (for example, an SiO$_2$ layer), and any suitable photoresist layer 46 which responds to exposure and development. In a preferred embodiment, photoresist layer 46 is a negative tone photoresist (e.g. resist is substantially removed on development only in the substantially unexposed regions). In an alternative embodiment, a positive photoresist is used with an image reversal step to effectively utilize it as a negative tone material. In either case, a second optical exposure in the same photoresist level may be used to delimit the areas of the circuit over which the interferometric lithography pattern is defined, for example, to the core areas of a DRAM circuit.

With respect to FIG. 9B, photoresist 46 is suitably exposed using interferometric lithography and suitably developed, thereby forming a periodic pattern 48 (at pitch $p_{min}$) in photoresist 46. In a preferred embodiment, periodic pattern 48 comprises an array of lines at a substantially minimum pitch having a width substantially less than about $p_{min}/4$. With reference to FIG. 9C, any suitable etching process preferably transfers periodic pattern 48 (the lines) into hard mask 44. In a preferred embodiment, a very thin hard mask layer 44 is used such that the etching process does not have to be highly anisotropic. After etching, remaining photoresist 46 is suitably stripped.

Figure 9D:
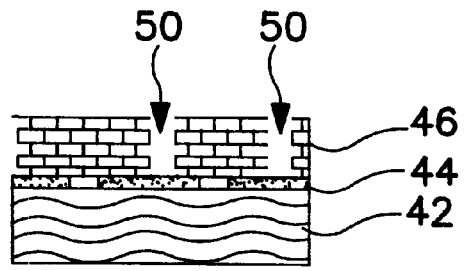
Figure 9E:
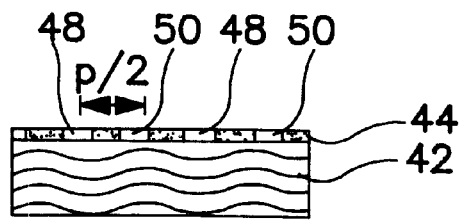

With reference to FIG. 9D, a new photoresist layer 46 is suitably applied and structure 40 is suitably re-exposed and developed at substantially the same pitch, but with pattern 50 offset by $p_{min}/2$, thereby interpolating new lines 50 between (e.g. midway) previously defined lines 48 in hard mask 44. With reference to FIG. 9E, any suitable etching process preferably transfers lines 50 into hard mask material 44, thereby resulting in a pattern 48, 50 with about one half the pitch of original structure 40. Mathematically, this sequence of operations is represented as:

$$T(x) = \tau[E_1(x)] \times \tau[E_2(x)] \tag{7}$$

$$= \frac{a}{2} \left\{ \sum_{n=-\infty}^{\infty} \left[ \frac{\sin\left(\frac{2\pi n a \sin(\theta)}{\lambda}\right)}{\left(\frac{2\pi n a \sin(\theta)}{\lambda}\right)} e^{i\frac{4\pi n x \sin(\theta)}{\lambda}} \right] + \sum_{n=-\infty}^{\infty} \left[ \frac{\sin\left(\frac{2\pi n a \sin(\theta)}{\lambda}\right)}{\left(\frac{2\pi n a \sin(\theta)}{\lambda}\right)} e^{i\pi n} e^{i\frac{4\pi n x \sin(\theta_y)}{\lambda}} \right] \right\}$$

$$= \frac{a}{2} \left\{ \sum_{n=-\infty}^{\infty} \left[ \frac{\sin\left(\frac{2\pi n a \sin(\theta)}{\lambda}\right)}{\left(\frac{2\pi n a \sin(\theta)}{\lambda}\right)} e^{i\frac{8\pi n x \sin(\theta)}{\lambda}} \right] \right\}$$

where the factor of $e^{i\pi n} = (-1)^n$ in the second term arises because of the half-pitch shift of the second pattern. As a result, the even terms in the summations add, the odd terms cancel, and the final result is just the expression for a periodic square wave structure at twice the period [4 sin (θ)/l] of each exposure.

With reference to FIGS. 10A–10F, in an alternative embodiment, a similar process to FIGS. 9A–9E (subtractive process with etching) is shown which similarly results in a factor of two multiplication of the pitch, except a positive tone photoresist is used in an additive process (deposition). Namely, photoresist layer 66 is preferably a positive tone photoresist (e.g. resist is substantially removed on development only in the substantially exposed regions). With reference to FIG. 10A, a preferred exemplary structure includes the material in which a pattern is suitably formed 62 and any suitable positive tone photoresist layer 66. With respect to FIG. 10B, and 10C positive photoresist 66 is suitably exposed using interferometric lithography and developed, thereby leaving positive photoresist 66 in a substantially periodic pattern 68 of a pitch of about $p_{min}$. In a preferred embodiment, periodic pattern 68 comprises an array of lines at a substantially minimum pitch having a width substantially less than about $p_{min}/4$.

With reference to FIG. 10C, any suitable mask material 64 is preferably deposited substantially everywhere except in the region of positive photoresist 66, then positive photoresist 66 is suitably stripped. With reference to FIG. 10D, a new positive photoresist layer 66 is suitably applied and structure 60 is suitably re-exposed interferometrically and suitably developed at substantially the same pitch, but with pattern 70 offset by about $p_{min}/2$, thereby leaving photoresist 66 about midway between previously defined lines 68 in hard mask 64. A second mask layer 72 is then suitably deposited substantially everywhere but in the region of remaining photoresist 66, thereby serving as an etch mask to allow etching of etch mask 64. With respect to FIG. 10E, positive photoresist 66 is suitably stripped and, using mask layer 72 as an etch mask, lines 70 are suitably etched into mask 64. With respect to FIG. 10F, any suitable stripping process preferably removes second mask layer 72, thereby resulting in a pattern 68, 70 with about one half the pitch of original structure 60. In a further alternative embodiment, the process of FIGS. 10A–10F is suitably reversed by known image reversal techniques using positive tone resists.

The alignment between the two exposures described above (with respect to either FIGS. 9A–9E or FIGS. 10A–10F) can be accomplished by any suitable method. In a preferred embodiment, the alignment between the two exposures are suitably accomplished by the techniques described in U.S. Pat. No. 5,216,257—S. R. J. Brueck and Saleem H. Zaidi, Method and Apparatus for Alignment and Overlay of Submicron Lithographic Features (issued Jun. 1, 1993) and U.S. Pat. No. 5,343,292—S. R. J. Brueck and Saleem H. Zaidi, Method and Apparatus for Alignment of Submicron Lithographic Structures (issued Aug. 30, 1994), which are all herein incorporated by reference. In brief, the incident writing beams (or other longer wavelength, non-actinic beams) preferably impinge on the pattern resulting from the first exposure. The beams diffracted from the grating on the wafer surface are suitably caused to interfere with a standard interferometric optical system (mirrors and beamsplitters) and are preferably incident on an appropriate detector. The resulting projection moire fringe pattern is suitably used to set both the spatial frequency and the phase (offset) of the second exposure. In an alternative embodiment, a substantially similar process to the process described above for alignment of multiple interferometric lithography exposures is used to suitably align an interferometric lithography exposure to an optical lithography exposure.

An exemplary demonstration of subtractive spatial frequency doubling is shown in FIGS. 11A–11C. In this exemplary embodiment, the starting material includes <110> Si (to allow anisotropic KOH etching as a final pattern transfer step) with a thin (~50-nm) $Si_3N_4$ sacrificial cap layer. This photoresist process uses image reversal with a 257-nm (doubled Ar-ion laser) source. FIG. 11A shows an exemplary SEM after the first etch, as demonstrated in FIG. 10C, with a pitch of approximately 260 nm. FIG. 11B shows the exemplary results after the second etch, as demonstrated in FIG. 10F, with the pitch suitably reduced to ~130 nm and the CD to ~60 nm. Finally, FIG. 11C shows the exemplary results of an anisotropic KOH etch of 130-mm pitch pattern into the Si using the nitride layer as a hard mask. In FIG. 10C, some etching of the sidewalls has occurred in the KOH etch step resulting in thinner lines and a smaller line:space ratio, namely the final Si linewidth is as small as about 20–40 nm.

In a preferred embodiment, this multiple exposure technique (as disclosed above with respect to FIGS. 9A–9E and FIGS. 10A–10F) is suitably repeated a number of times with appropriate offsets to produce pitches of about p/N where N=1 (original pattern), 2 (one additional exposure and processing sequence), 3 (two additional exposures and processing sequences), etc.

In an alternative embodiment, this technique can be extended to two-dimensional patterning by using either multiple exposures and/or multiple-beam single exposures. For a grid of holes or posts with equal pitches, $p_1$, in both the x- and y-directions, a second exposure at the same pitch but shifted by $p_1/2$ in x and $p_1/2$ in y decreases the pitch (now $p_2$) to approximately $p_2=p_1/\sqrt{2}$. With two further exposures a new pitch (now $p_3$) of approximately $p_3=p_1/2$ is achieved. As discussed above, nonlinearities allow the extension of optics beyond the linear systems limit. As such, higher spatial frequencies can be accessed by taking advantage of nonlinearities in processing. In other words, the linear systems constraints apply to pattern frequencies, not to linewidths. This is dramatically illustrated by the micrograph in FIG. 11D that shows a 50-nm CD line on a 2-$\mu$m pitch, a line:space ratio of 1:20. The very high spatial frequencies corresponding to this narrow line are the result of photoresist process nonlinearities, the exposure aerial image was a 2-$\mu$m period sine wave. Importantly, the process latitude for printing this fine line was much greater than that for printing the 150-nm dense line:space pattern. This is a superior result in that it is always more difficult to print 1:1 patterns since these occur very near the threshold dose for developing all the way through the resist. Larger line:space ratios are closer to saturation where the process is very forgiving of small dose variations and the nonlinearities (vertical sidewalls) are larger. Thus, it is easier (greater process latitude) to print smaller CD structures at a fixed pitch.

FIG. 11E shows a concept drawing of how the aforementioned frequency doubling technique might be applied to a circuit pattern, in this case a typical SRAM pattern. The two colors indicate the patterns written in each exposure. No two features of the same color approach each other by less than 1.5 CD. The spacing is less than 2 CD because of the staggered features in the SRAM pattern, so changing the design to a CD grid would allow a straightforward doubling of the pattern density.

As shown below in FIGS. 12–17, the present multiple exposure technique substantially uniformly produces structures with a linewidth less than the pitch and substantially accurately aligns the two exposures, so the present invention increases N.

In accordance with a preferred embodiment, for larger pitches, structures with linewidths a factor of 40 less than the pitch have been produced. With respect to FIG. 12, a 0.05-$\mu$m wide photoresist line on a 2-$\mu$m pitch with a line:space ratio of 1:40 is shown. This experiment used a positive tone photoresist in accordance with FIGS. 9A–9F; however, the process could be reversed with a negative tone resist or by known image reversal techniques using positive tone resists.

With respect to FIG. 14, an example of a dense array of 90-nm diameter holes defined in a photoresist layer on a 180-nm pitch is shown. This pattern is suitably written in a double exposure process with two two-beam grating exposures and the wafer rotated by 90° between exposures. With respect to FIG. 15, another example of a dense, hexagonal close packed pattern written with three two-beam exposures and the wafer rotated 120° between exposures is shown.

Multiple (greater than two) beam exposures suitably include another degree of freedom. With respect to FIG. 16, an exemplary 2-D hole pattern suitably written with a five-beam geometry in a single exposure is shown. In a preferred embodiment, the multiple beam exposures suitably create more complex features, with correspondingly enhanced surface area. With respect to FIG. 17, an exemplary calculation is shown with the structures obtained with the five-beam geometry of FIG. 16 when the exposure flux is increased to form an array of posts rather than the array of holes. As seen in FIG. 17, the posts are substantially hollow cylindrical forms (donuts) having both inner and outer surfaces, thereby approximately doubling the perimeter when compared with the simple hole arrays of FIG. 16. The approximate doubling of the perimeter in FIG. 17 leads to further enhanced surface area when suitably etching these structures into the polysilicon contact material. Compared to the one dimensional structures, two-dimensional features typically experience comparable or even greater surface area enhancements. Furthermore, with two-dimensional structures, the impact of a defect (e.g. too thin of a wall that collapses) is suitably lowered.

In addition to DRAM capacitors, multiplying the spatial frequency of lithographically defined structures suitably allows for substantial improvements in, inter alia, crystal growth, quantum structure growth and fabrication, flux pinning sites for high-$T_c$ superconductors, form birefringent materials, reflective optical coatings, photonic bandgap, electronics, optical/magnetic storage media, arrays of field emitters and in other applications requiring large areas of nm-scale features.

More particularly, in another preferred embodiment, the present invention is suitably applied to textured substrates for crystal growth. An array of small scale structures is suitably fabricated as the epitaxial growth surface ("bed of nanoneedles"). At the initiation of growth, small islands of growth rather than the monolithic substrates are preferably used. This approach typically has advantages for growth of strained materials where the epitaxial film has a significantly different lattice constant than does the substrate material. For this "bed of nanoneedles" approach, edge effects and strain relaxation suitably provide advantages over monolithic growth.

Application of the present invention to quantum structure growth and fabrication is similar to the above crystal growth application with the exception that the growth typically involves at least two materials: a lower bandgap material surrounded by a higher bandgap material to provide a quantum wire or a quantum dot. The present invention suitably further reduces the dimensionality of quantum wells from 2-D sheets to 1-D wires and 0-D boxes by uniformly defining nucleation sites.

With respect to flux pinning sites for high-$T_c$ superconductors, the present fabrication technique suitably provides flux pinning sites by inducing localized defects in the film to trap the flux lines. In order to achieve the desired critical currents, the density of trap sites is preferably on the nm-scale (~5–50 nm spacings). To induce these defects, the film is preferably denatured using a lithographic step after growth. Alternatively, defects are preferably induced in the crystal substrate before film growth because there is less risk of destroying the superconducting properties of the film.

The present invention suitably provides periodic structures, such as gratings, which preferably play a very important role in optics. The periodicities produced by the present invention are preferably shorter than the optical wavelength such that the improved periodicities give rise to significant modifications in both the linear and nonlinear optical response of materials. For example, the resulting one-dimensional gratings with pitches much less than the wavelength preferably result in a birefringent response such that the reflectivity and transmission differs between light polarized along the grating and light polarized perpendicular to the grating. Since the pitch is less than the wavelength, there are no diffracted orders from such a grating, implying high efficiency. This is known as form birefringence and offers the potential for a wide range of optical components.

Reflective optical coatings, known as Bragg reflectors, often consist of layered stacks of different materials with each layer having a ¼ wave optical thickness. Very high reflectivities are preferably achieved, even with relatively small refractive index differences between the materials. The extension to a periodic three dimensional optical structure is known as a photonic crystal. In the same way as semiconductor crystals have forbidden energy gaps within which electrons cannot exist, photonic crystals exhibit photonic bandgaps where specific wavelength bands of light cannot penetrate. The present invention provides a technique for large-scale manufacturing of the nano-scale two-dimensional patterns required for manufacturing photonic crystals for the infrared, visible and ultraviolet spectral regions. Further, using the present invention, defects may be suitably formed in this structure which give rise to important classes of optical emitters with unique properties such as thresholdless lasers.

The present invention is also preferably used to increase the number of transistors on semiconductor electronics, thereby allowing more and more smaller and smaller devices.

With respect to optical/magnetic storage media, the present invention defines individual nm-scale single-domain sites which preferably improve the storage density by reducing interactions between the information stored on individual sites. Moreover, by lithographically defining features on the media in accordance with the present invention, the tracking electronics preferably resolves smaller distances.

With respect to arrays of field emitters, as discussed above for quantum structures, for all of these techniques there can be a significant advantage in terms of feature and current density to starting with a higher resolution lithographic technique. The present invention also suitably simplifies the fabrication process by defining the initial structures in the nm range rather than the $\mu$m range.

While the present invention has been described in conjunction with the preferred and alternate embodiments set forth in the drawing figures and the specification, it will be appreciated that the invention is not so limited. For example, the method and apparatus for multiplying spatial frequency can also be used for other semiconductor-manufacturing related applications including test-structures for the development of next generation processing tools, flat-panel displays and any other application which requires low-cost, large-area, nm-scale patterning capability. Various modifications in the selection and arrangement of components and materials may be made without departing from the spirit and scope of invention as set forth in the appended claims.

We claim:

1. A method for obtaining a pattern wherein the Fourier transform of said pattern contains high spatial frequencies by combining nonlinear functions of intensity of at least two exposures combined with at least one nonlinear processing step intermediate between the two exposures to form three dimensional patterns comprising the steps of:

coating a substrate with a first photoresist layer;

exposing said first photoresist layer with a first exposure;

developing said first photoresist layer to form a first pattern in said first photoresist layer, said first pattern containing spatial frequencies greater than those in a two dimensional optical intensity image imposed onto said photoresist layer in said first exposure as a result of a nonlinear response of said first photoresist layer;

coating said substrate with a second photoresist layer;

exposing said second photoresist layer with a second exposure;

developing said second photoresist layer to form a second pattern in said second photoresist layer, said second pattern containing spatial frequencies greater than those in a two dimensional optical intensity image imposed onto said photoresist layer in said second exposure as a result of a nonlinear response of said second photoresist layer;

combining said patterns to provide a final pattern.

2. The method of claim 1 wherein said first exposure includes a plurality of exposures forming a plurality of images.

3. The method of claim 1 wherein said second exposure includes a plurality of exposures forming a plurality of images.

4. The method of claim 1, wherein a minimum of said spatial frequencies along at least one direction in said first or second pattern is smaller than $2/\lambda$.

5. The method of claim 1, wherein said intermediate nonlinear processing step enables a frequency distribution of said pattern which is altered from frequency distributions of only said first and said second exposure.

6. A method for obtaining a pattern wherein the Fourier transform of said pattern contains high spatial frequencies by combining nonlinear functions of intensity of at least two exposures combined with at least one nonlinear processing step intermediate between the two exposures to form three dimensional patterns comprising the steps of:

coating a substrate with a first mask material and a first photoresist layer;

exposing said first photoresist layer with a first exposure developing said photoresist to form a first pattern in said first photoresist layer, said first pattern containing spatial frequencies greater than those in a two dimensional optical intensity image imposed onto said photoresist layer in said first exposure as a result of a nonlinear response of said first photoresist layer;

transferring said first pattern into said first mask material, said first mask material comprising at least one of $SiO_2$, $Si_3N_4$, a metal, a polysilicon and a polymer;

coating said substrate with a second photoresist;

exposing said second photoresist with a second exposure developing said second photoresist layer to form a second pattern in said second photoresist layer, said second pattern containing spatial frequencies greater than those in a two dimensional optical intensity image imposed onto said photoresist layer in said second exposure as a result of a nonlinear response of said second photoresist layer;

transferring said first pattern and said second pattern into said substrate using a combined mask including parts of said first mask layer and said second photoresist;

removing said first mask material and said second photoresist.

7. The method of claim 6 wherein said transferring step includes at least one of etching, deposition and-lift off, and damascene.

8. A method for increasing spatial frequency content of lithographic patterns comprising the steps of:

depositing a material;

depositing a photoresist on said material;

exposing a periodic image in said photoresist, said periodic image having a pitch $p_{min}$ and a linewidth less than $p_{min}/2$;

developing said periodic image to form a periodic pattern in said photoresist;

transferring said periodic pattern to said material;

depositing a second photoresist layer on said material;

offsetting said periodic pattern by $p_{min}/2$;

repeating said exposing, developing and transferring steps, thereby interpolating new said pattern midway between said pattern.

9. The method of claim 8, wherein said step of depositing a material includes depositing doped polysilicon.

10. The method of claim 8, wherein said material includes an $SiO_2$ overlayer configured to act as a hardmask during said etching step.

11. The method of claim 8, wherein said step of depositing a photoresist includes depositing at least one of a negative photoresist, a positive photoresist and a positive photoresist with an image reversal step.

12. The method of claim 8, wherein said step of exposing a photoresist includes exposing using interference lithography.

13. The method of claim 8, wherein said step of exposing a photoresist includes exposing using interference lithography in combination with another lithographic technique.

14. The method of claim 8, wherein said step of exposing a photoresist includes exposing using interference lithography in combination with an optical stepper.

15. The method of claim 8, wherein said step of exposing a photoresist includes image reversal.

16. The method of claim 8, wherein said step of developing said periodic pattern includes etching said pattern into a hardmask.

17. The method of claim 8, wherein said exposing step includes exposing with at least one of multiple exposures and multiple-beam single exposures.

18. The method of claim 8, wherein said step of depositing a material includes depositing a material on at least one of a textured substrate, a quantum structure, a flux pinning site for high-$T_c$ superconductors, a birefringent material, a reflective optical coating, a photonic bandgap, an electronic device, an optical storage media, a magnetic storage media, an array of field emitters and a Dynamic Random Access Memory capacitor.

19. A method for multiplying the spatial frequency content of a one-dimensional line/space pattern consisting of the steps of:

providing a substrate;

depositing a material on said substrate;

depositing a photoresist on said material;

exposing and developing a periodic pattern in said photoresist, said periodic pattern having a pitch $p_{min}$ and a linewidth less than $p_{min}/2$;

transferring said periodic pattern into said material by a process step;

removing said first photoresist layer;

depositing a second photoresist layer;

exposing said second photoresist layer with said periodic pattern offset by $p_{min}/2$;

repeating the exposing, developing and transferring steps N times with offsets of $p_{min}/N$, thereby interpolating N new said patterns equally spaced midway between said pattern, etching exposed said material down to a predetermined depth, thereby transferring said pattern through said material;

transferring said pattern into said substrate.

20. The method of claim 19, wherein said step of depositing a material includes depositing in-situ doped polysilicon.

21. The method of claim 19, wherein said material includes an $SiO_2$ overlayer configured to act as a hardmask during said etching step.

22. The method of claim 19, wherein said step of depositing a photoresist includes depositing at least one of a negative photoresist, a positive photoresist and a positive photoresist with an image reversal step.

23. The method of claim 19, wherein said step of exposing a photoresist includes exposing using interference lithography.

24. The method of claim 19, wherein said step of exposing a photoresist includes exposing using interference lithography in combination with a lithographic technique.

25. The method of claim 19, wherein said step of exposing a photoresist includes exposing using interference lithography in combination with an optical stepper.

26. The method of claim 19, wherein said step of exposing a photoresist includes image reversal.

27. The method of claim 19, wherein said step of developing said periodic pattern includes etching said pattern into a hardmask.

28. The method of claim 19, further comprising at least one of multiple exposures and multiple-beam single exposures.

29. The method of claim 19, wherein said pattern size avoids overlapping of pattern features upon doubling of said frequency.

30. The method of claim 19, further comprising registering said periodic pattern to a contact patterning.

31. The method of claim 19 further comprising the step of allowing about 100 nm between adjacent said patterns.

32. The method of claim 19, wherein said step of depositing a material includes depositing an NO layer.

\* \* \* \* \*

UNITED STATES PATENT AND TRADEMARK OFFICE
CERTIFICATE OF CORRECTION

PATENT NO. : 6,042,998  
APPLICATION NO. : 08/932428  
DATED : March 28, 2000  
INVENTOR(S) : Steven R. J. Brueck et al.

Page 1 of 1

It is certified that error appears in the above-identified patent and that said Letters Patent is hereby corrected as shown below:

In column 1, after the title and "RELATED APPLICATIONS," please insert the following paragraph:

-- This application is a continuation-in-part of U.S. Patent Application No. 08/490,101 filed June 6, 1995, which has matured into U.S. Patent No. 5,705,321, which is a continuation of U.S. Patent Application No. 08/123,543 filed September 20, 1993 and now abandoned. --

Signed and Sealed this

Thirtieth Day of December, 2008

JON W. DUDAS  
*Director of the United States Patent and Trademark Office*

UNITED STATES PATENT AND TRADEMARK OFFICE
Certificate

Patent No. 6,042,998                                                                                  Patented: March 28, 2000

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Steven R. J. Brueck, Albuquerque, NM (US); Saleem H. Zaidi, Albuquerque, NM (US); Steve Hersee, Albuquerque, NM (US); and Kevin Malloy, Albuquerque, NM (US).

Signed and Sealed this Fifth Day of October 2010.

*MARK F. HUFF*
*Supervisory Patent Examiner*
*Art Unit 1795*
*Technology Center 1700*